US008403680B2

(12) United States Patent
Schultz

(10) Patent No.: US 8,403,680 B2
(45) Date of Patent: Mar. 26, 2013

(54) MAGNETICALLY ENHANCED ELECTRICAL SIGNAL CONDUCTION APPARATUS AND METHODS

(71) Applicant: Magnetic Innovations LLC, Plano, TX (US)

(72) Inventor: Ricky David Schultz, Plano, TX (US)

(73) Assignee: Magnetic Innovations LLC, Plano, TX (US)

( * ) Notice: Subject to any disclaimer, the term of this patent is extended or adjusted under 35 U.S.C. 154(b) by 0 days.

(21) Appl. No.: 13/624,661

(22) Filed: Sep. 21, 2012

(65) Prior Publication Data

US 2013/0017691 A1    Jan. 17, 2013

Related U.S. Application Data

(62) Division of application No. 12/839,855, filed on Jul. 20, 2010, now Pat. No. 8,272,876.

(51) Int. Cl.
 *H01R 11/30* (2006.01)
(52) U.S. Cl. .......................................... 439/38; 439/305
(58) Field of Classification Search ................ 174/74 R; 439/38, 39, 40, 305, 620.05, 620.03, 620.21, 439/950
See application file for complete search history.

(56) References Cited

U.S. PATENT DOCUMENTS

| 3,521,216 A | 7/1970 | Tolegian |
| 3,750,083 A | 7/1973 | Fayling |
| 3,808,577 A | 4/1974 | Mathauser |
| 3,845,573 A | 11/1974 | Kasamatsu |
| 4,844,582 A | 7/1989 | Giannini |
| 5,011,434 A * | 4/1991 | Blunt .................. 439/620.21 |
| 5,401,175 A | 3/1995 | Guimond et al. |
| 5,650,908 A | 7/1997 | Stanton |
| 5,921,783 A | 7/1999 | Fritsch et al. |
| 6,109,971 A | 8/2000 | Vadlakonda |
| 6,443,770 B1 | 9/2002 | Lin |
| 6,565,363 B2 | 5/2003 | Downing |
| 6,966,781 B1 | 11/2005 | Bullinger et al. |
| 7,204,695 B1 | 4/2007 | Shiu et al. |
| 7,264,479 B1 | 9/2007 | Lee |

(Continued)

OTHER PUBLICATIONS

"Hydrogen Tap (Electrictiy Through Magnetic Field) 100," http://www.youtube.com/watch?v=ItnIviCqu70, May 29, 2007, 1 page.

(Continued)

*Primary Examiner* — Hae Moon Hyeon
(74) *Attorney, Agent, or Firm* — Slater & Matsil, L.L.P.

(57) ABSTRACT

Apparatus and methods for magnetically enhanced electrical signal conduction are disclosed. An embodiment electrical connector comprises a connector body, a first active signal contact mechanically attached to and at least partially disposed within the connector body, a ground contact mechanically attached to the connector body, an insulator mechanically separating and electrically isolating the first active signal contact and the ground contact, and a first permanent magnet electrically connected to the first active signal contact. An embodiment electrical cable comprises an elongated insulating sheath, a first active signal electrical conductor disposed within the sheath, a first connector body mechanically attached to a first end of the sheath, a first active signal contact mechanically attached to the first connector body, and electrically connected to the first active signal electrical conductor, and a first permanent magnet electrically connected to the first active signal electrical conductor.

62 Claims, 20 Drawing Sheets

U.S. PATENT DOCUMENTS

| | | |
|---|---|---|
| 7,348,785 B2 | 3/2008 | Maxwell |
| 7,351,066 B2 | 4/2008 | DiFonzo et al. |
| 7,402,045 B2 | 7/2008 | Schwartzbart et al. |
| 7,467,948 B2 | 12/2008 | Lindberg et al. |
| 7,722,358 B2 | 5/2010 | Chatterjee et al. |
| 7,771,202 B2 | 8/2010 | Amotz et al. |
| 7,775,801 B2 | 8/2010 | Shiff et al. |
| 8,272,876 B2 * | 9/2012 | Schultz .......................... 439/38 |
| 2001/0050605 A1 | 12/2001 | Sugiura et al. |
| 2011/0070747 A1 | 3/2011 | Ball |
| 2011/0244697 A1 | 10/2011 | Melby et al. |

OTHER PUBLICATIONS

"Hydrogen Tap (Zero Field using 9v AC 800 ma) 101," http://www.youtube.com/watch?v=mV70KQCH3lo&NR=1, May 30, 2007, 1 page.

"Spark in spiral magnetic field," http://www.youtube.com/watch?v=FrGtPKBXkVQ, Sep. 10, 2007, 1 page.

"EMI Control Applications Notes for Typical Computer Subsystems: Video Controllers & Cables," Technical Information, 1999, pp. 1-7.

"Ricky David Shultz Statement re Cable with Magnet," disclosed prior to 2010, 6 pages.

* cited by examiner

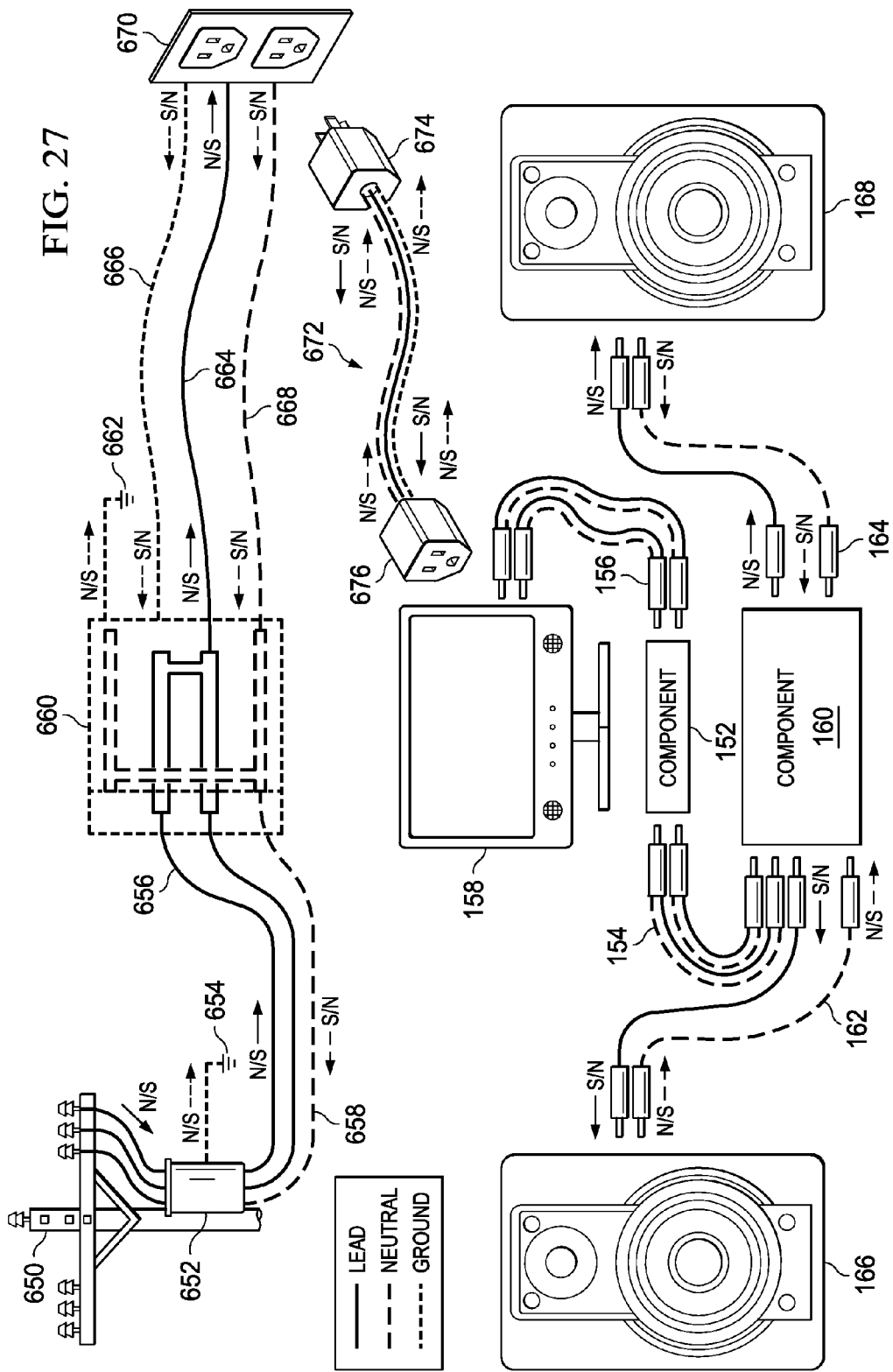

MAGNETICALLY ENHANCED ELECTRICAL SIGNAL CONDUCTION APPARATUS AND METHODS

This application is a divisional of U.S. patent application Ser. No. 12/839,855, entitled "Magnetically Enhanced Electrical Signal Conduction Apparatus and Methods," filed on Jul. 20, 2010, which application is hereby incorporated herein by reference.

TECHNICAL FIELD

The present invention relates generally to apparatus and methods for electrical signal conduction, and more particularly to apparatus and methods for magnetically enhanced electrical signal conduction.

BACKGROUND

Generally, there currently exists a large variety of cables and connectors for signal conduction. The signals transmitted via cables and connectors generally may be data signals or power signals. For example, in an audio-video system, power cables and connectors provide power from a power source (e.g., 110/120 volts alternating current (VAC), 220/240 VAC) to the various components of the system. Data cables transfer data signals between components of the system, such as from analog or digital content-source components (e.g., optical disk players, satellite, cable or fiber boxes, media servers, digital video recorders, computers, cassette tape players) to an amplifier (e.g., pre-amplifier/power amplifier, integrated amplifier, receiver). The amplifier processes the input data signals (e.g., source switching, surround sound decoding, and amplification). Other data cables transfer outputs from the amplifier to devices that directly interact with a user (e.g., loudspeakers, headphones, televisions, monitors). In some systems, various combinations of these components may be integrated into a single unit. For example, a television may contain amplifier components so that a source device may connect directly to the television.

Essentially since the beginning of signal transmission, there has been a continuous effort in the art to improve the quality of data and power signals transmitted between devices, such as through cables and their connectors, as well as between components within devices.

SUMMARY OF THE INVENTION

Deficiencies in the prior art are generally solved or circumvented, and technical advantages are generally achieved, by preferred embodiments of the present invention, which utilize magnets to improve the quality of electrical signal transmission.

In accordance with an embodiment of the present invention, an electrical connector comprises a connector body, a first active signal contact mechanically attached to and at least partially disposed within the connector body, a ground contact mechanically attached to the connector body, an insulator mechanically separating and electrically isolating the first active signal contact and the ground contact, and a first permanent magnet electrically connected to the first active signal contact.

In accordance with another embodiment of the present invention, an electrical cable comprises an elongated insulating sheath, a first active signal electrical conductor disposed within the sheath, a first connector body mechanically attached to a first end of the sheath, a first active signal contact mechanically attached to the first connector body, and electrically connected to the first active signal electrical conductor, and a first permanent magnet electrically connected in series with the first active signal electrical conductor.

In accordance with another embodiment of the present invention, a method of forming an electrical connector comprises attaching a first active signal contact to a connector body, attaching a ground contact to the connector body, electrically insulating the first active signal contact from the ground contact, and electrically connecting a first permanent magnet to the first active signal contact.

In accordance with another embodiment of the present invention, a method of forming an electrical cable comprises disposing a first active signal electrical conductor in an elongated insulating sheath, attaching a first active signal contact to a first connector body, attaching the first connector body to a first end of the sheath, electrically connecting the first active signal contact to the first active signal electrical conductor, attaching a second active signal contact to a second connector body, attaching the second connector body to a second end of the sheath, electrically connecting the second active signal contact to the first active signal electrical conductor, and electrically connecting a first permanent magnet in series with the first active signal electrical conductor.

In accordance with another embodiment of the present invention, an electrical device comprises a device body, an active or passive electrical component mechanically supported by the device body, a first active signal conductor electrically connected to the electrical component, and mechanically attached to and at least partially disposed external to the device body, a second conductor electrically connected to the electrical component, and mechanically attached to and at least partially disposed external to the device body, and a first permanent magnet electrically connected to the first active signal conductor.

In accordance with another embodiment of the present invention, an electrical power transmission line comprises a first-phase conductor wire comprising a non-permanent-magnet ferromagnetic material, a second-phase conductor wire comprising the non-permanent-magnet ferromagnetic material, a third-phase conductor wire comprising the non-permanent-magnet ferromagnetic material, a first permanent magnet disposed inline with the first-phase conductor wire, a second permanent magnet disposed inline with the first-phase conductor wire, and a third permanent magnet disposed inline with the first-phase conductor wire.

In accordance with another embodiment of the present invention, a printed circuit board comprises a dielectric substrate, conductive signal traces disposed on the substrate, wherein one of the traces comprises a non-permanent-magnet ferromagnetic material, and a permanent magnet disposed on the substrate and coupled to the one of the traces comprising the non-permanent-magnet ferromagnetic material.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 27 is a diagram of an electrical system showing magnet orientation;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, primarily the utilization of magnets to improve signal quality transmission in audio-video systems. The invention may also be applied, however, to other systems, such as computer systems, power transmission systems, automobile and other vehicular electrical systems, and the like.

Improving signal (audio, video, power, and the like) quality by minimizing signal degradation in a conductive signal transmission medium such as a cable may include such different approaches changing the composition of the conductors, the number of conductors, the cross-section of the conductors, the winding/braiding of the conductors, as well as the types of connectors and methods of mating connectors.

Figure 1:
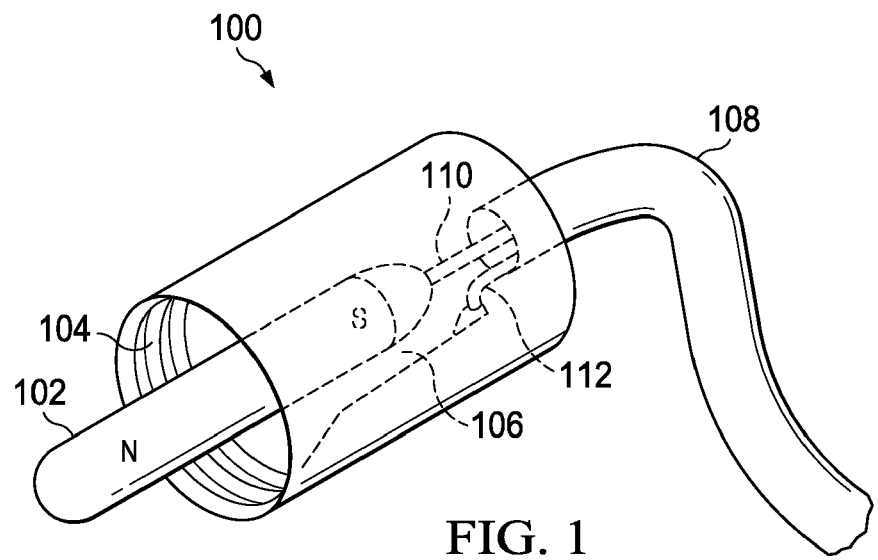
FIG. 1 is a diagram of a connector having a permanent magnet active signal pin.

With reference to FIG. 1, there is shown an a Radio Corporation of America (RCA) male connector 100 with the active signal pin 102 comprising a permanent magnet. In this embodiment, the magnet is oriented to have its north pole at the tip of the connector, while its south pole is oriented toward the cable end of the connector. In other embodiments, the poles of the magnet may be reversed so that the south pole is at the tip of the data signal pin on the connector, and the north pole is oriented toward the cable end of the connector. The connector also comprises a ground contact or ring 104, and insulator 106 disposed between the active signal pin 102 and the ground ring 104. Insulator 106 may comprise a plastic, ceramic, or other type of insulating material. Connector 100 also may comprise a jacket surrounding ground contact 104. The jacket may comprise metal, plastic, or other type of protective material. Connector 100 may be provided standalone, or, as shown, may be attached to cable 108. Active signal pin 102 is connected to active signal wire 110 in cable 108, and ground ring 104 is connected to ground wire 112 in cable 108.

In an experiment utilizing an RCA cable with one connector 100 at each end of the cable, nickel and gold plated neodymium magnets were used for the active signal pin in the RCA connectors. Upon inserting the cable into an audio system, there was a noted performance enhancement that provided the listener with increased musical detail and clarity, when compared with a using an RCA cable with standard RCA connectors having non-ferromagnetic, non-magnetized pins made of, e.g., copper, silver or brass. Potential benefits of using a permanent magnet in the circuit path with active (data or power) signal contacts such as pins and sockets may include improved signal to noise ratio, lower total harmonic distortion, lower intermodular distortion, an increase in low-level resolution, lower losses in the cabling, lower resistance in the connections, and a potential increase in energy efficiency, for example.

Figure 2:
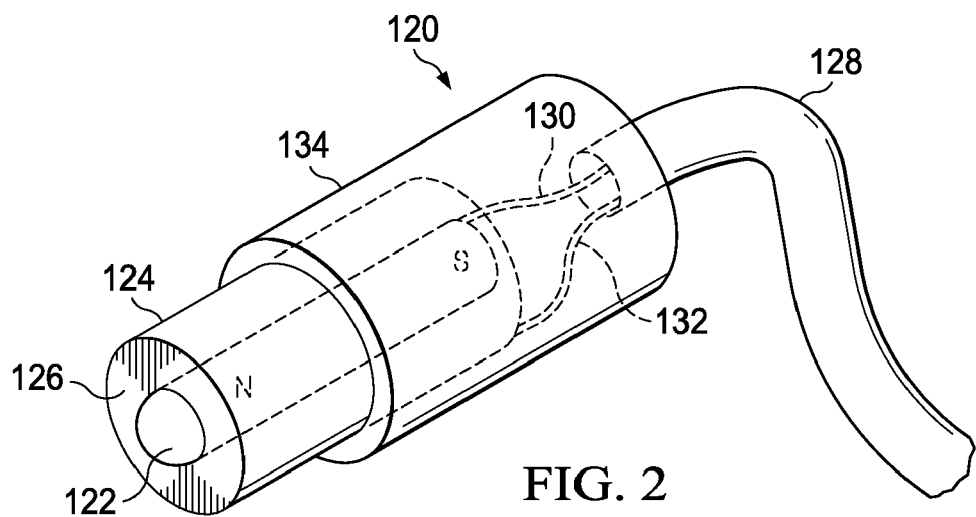
FIG. 2 is a diagram of a connector having a permanent magnet active signal socket.

FIG. 2 illustrates an RCA female connector 120 with the active signal socket 122 comprising a permanent magnet. In this embodiment, the magnet is oriented to have its north pole at the tip of the connector, while its south pole is oriented toward the cable side of the connector. In other embodiments, the poles of the magnet may be reversed so that the south pole is at the tip of the connector, and the north pole is oriented toward the cable side of the connector. The connector also comprises a ground contact, ring 124, and insulator 126 disposed between the active signal socket 122 and the ground ring 124. Insulator 126 may comprise a plastic, ceramic, or other type of insulating material.

Connector 120 may be provided standalone, or, as shown, may be attached to cable 128. When connector 120 is mounted on a cable, it also may comprise an insulating (e.g., plastic) jacket 134 surrounding ground ring 124. In the cable application, active signal socket 122 is connected to active signal wire 130 in cable 128, and ground ring 124 is connected to ground wire 132 in cable 128. Alternatively, connector 120 may be mounted on an electronic device for mating with a cable comprising a male RCA connector. In this case, instead of insulating jacket 134, connector 120 generally may comprise a mount for attaching the connector to a panel of the electronic device. It also may comprise terminations for attaching active signal socket 122 and ground ring 124 to internal wires or printed circuit board connections, e.g., with solder.

Furthermore, a cable may comprise (per signal) two male connectors, two female connectors, or one or more of each. Alternatively, a connector adaptor may comprise a male connector on one end and a female connector on the other end, which adaptor may be connected inline with an existing cable. For any of the embodiments, either one connector or both connectors in a cable may comprise a permanent magnet for the active signal contacts, such as pins and sockets. In addition to the active signal, the ground and/or neutral connection also may utilize a permanent magnet in its signal path, in this and all other embodiments disclosed herein.

Figure 3:
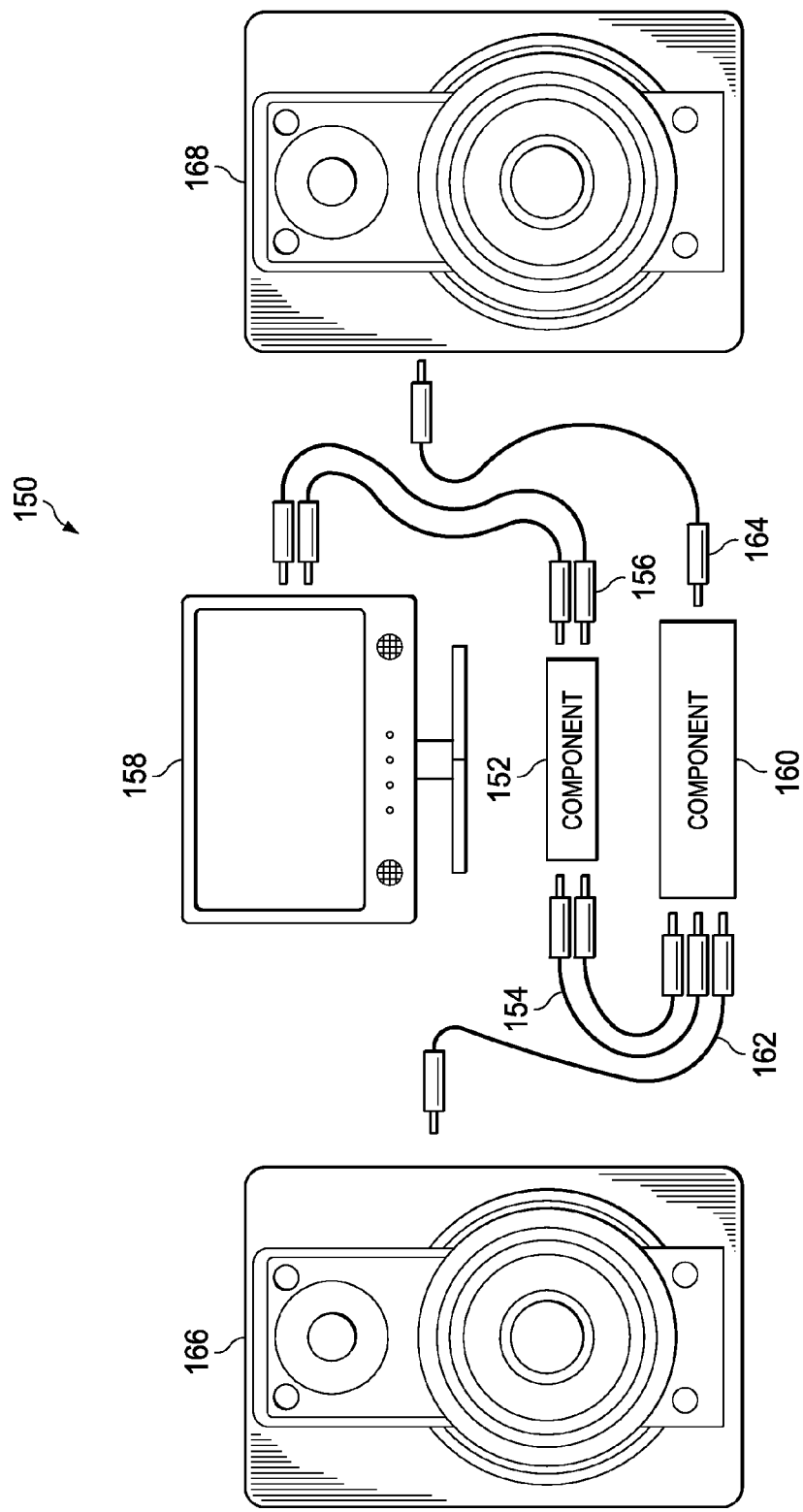
FIG. 3 is a block diagram of an audio-video system having cables with permanent magnets.

FIG. 3 illustrates an audio-video system 150 and examples of cables connecting the various components. Any of the cables connecting the different components in an audio-video system may incorporate connectors with permanent magnets installed as active signal pins or sockets. As described in detail below, the particular type of cable and connectors used to connect different components may be selected from a wide variety of cables and connectors. In this embodiment, a media source device, such as digital video disc (DVD) player 152, generates both audio and video signals, which are output through cables 154 and 156, respectively. Cables 156 provide the video signal to television 158. As an example, a single RCA cable may provide a composite video signal to television 158. As another example, three RCA cables may provide component video signals to television 158. Audio signals are provided to amplifier 160 via cables 154. As an example, two RCA cables may provide left and right audio signals to amplifier 160. Amplifier 160 provides speaker level outputs via cables 162 and 164 to speakers 166 and 168, respectively. As an example, these cables may comprise connectors that allow connection to five-way binding posts, which allow the connection of banana plugs, pin connectors, bare wire, or ring or spade lug terminals. For loud speaker connections, the active signal and ground generally are connected with separate connectors.

Figure 4:
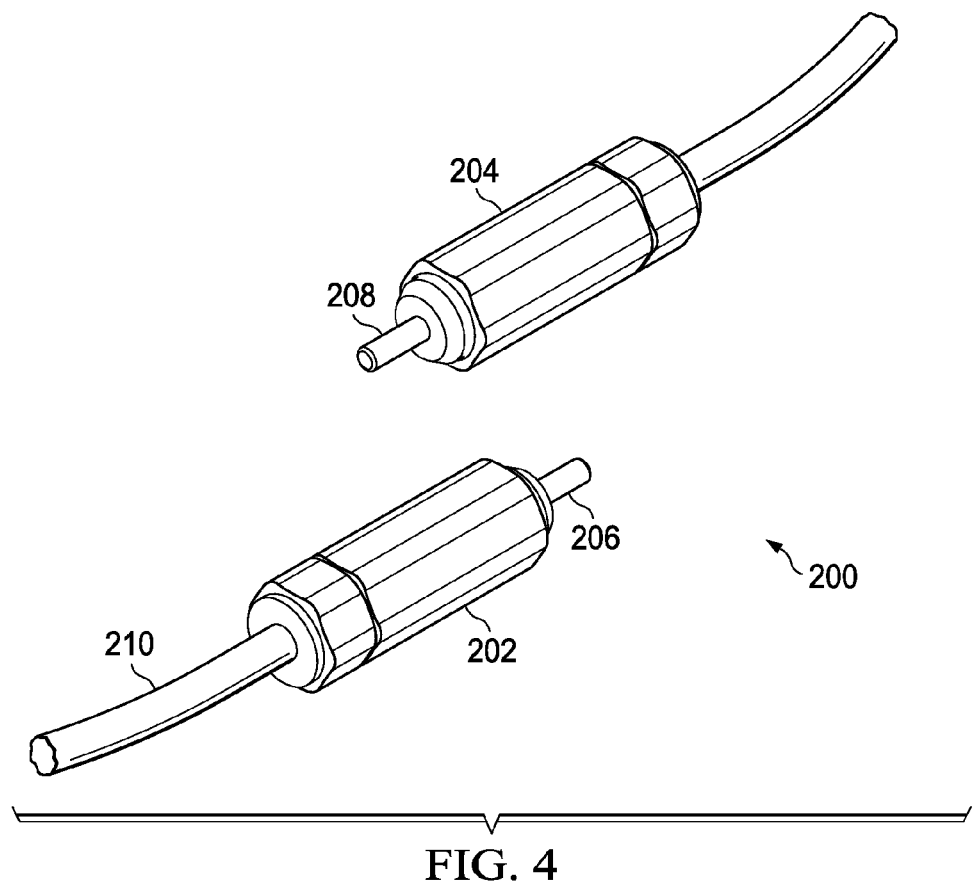
FIG. 4 is a diagram of a cable with permanent magnets.
Figure 5:
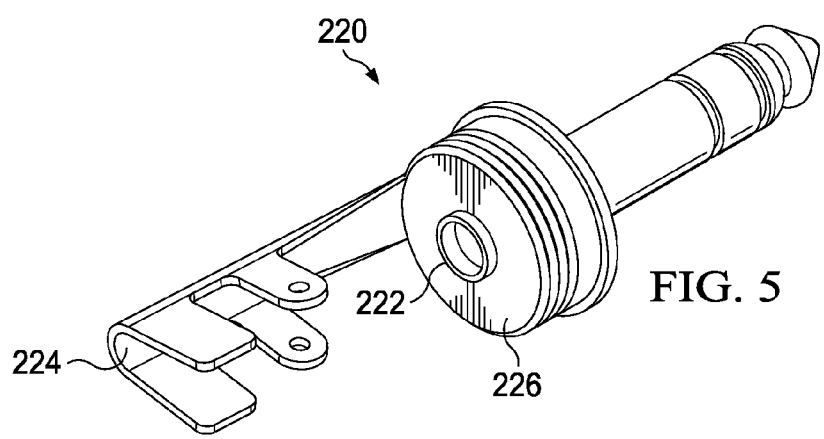
FIG. 5 is a diagram of a connector having a permanent magnet utilized as part of the active signal pin.

FIGS. 4 and 5 illustrate examples of different connectors with permanent magnet pins that may be used in an audio-video system. FIG. 4 shows an RCA cable 200 having two male connectors 202 and 204 with permanent magnet pins 206 and 208, respectively. The contacts in the two connectors are connected to their respective counterparts via conductors disposed within insulating sheath 210. FIG. 5 illustrates a ¼ inch plug 220 having a center active signal pin 222 comprising a permanent magnet. Insulation 226 separates active signal pin 222 from ground ring 224.

Comparison tests were run to determine some of the effects of using magnet center-pin connectors in audio signal cables. The tests were performed to analyze the differences in recorded output signal using the two different cables. The tests involved measurement of harmonic distortion, noise, and signal-to-noise ratio (SNR).

In particular, two analog signal cables were compared. The tested cables contained ferromagnetic steel based conductors. The connectors on the cables were both single-ended RCA connectors. One cable included a standard non-magnet center pin in its connector, while the other cable included magnet center pin in its connector. Specifically, one connector used a typical gold-plated brass/bronze center pin. The other connector used a rare-earth magnet with gold-plating for the center pin to create a magnetized conductor.

The signal voltage for standard inter-component audio signals is typically between 0 V to 2 volts root mean square (V RMS), and generally with negligible or little current. The frequency range is typically 20 Hz to 20,000 Hz, with some systems requiring a frequency range up to 50,000 Hz. The test signal was a 1,000 Hz sine wave generated with a notebook computer using a TrueRTA real time analyzer (RTA) Tone Generator. A first test was run using a 1 kHz sine wave at −10 dB, or about 0.2 volts amplitude. Because a standard signal voltage level is generally about 1 volt, this test was determined to be run at too low a voltage level to provide meaningful results based on the capabilities of the test setup. Accordingly, a second test was run using a 1 kHz sine wave at a more realistic −3 dB, or about 1.0 volt amplitude, which better represents a typical inter-component voltage level. For completeness, however, the results of both tests are provided below.

The computer generated test signal was in a digital format. The digital test signal was then converted to analog internally within the computer using a linear phase reconstruction filter. The digital-to analog converter (DAC) within the computer outputted an analog signal via a ⅛" female plug. A ⅛" to RCA adaptor was inserted into the computer analog output, and the test cables were alternatively inserted into the adaptor. The analog signals were then recorded using a Tascam US-122L recording device. The Tascam US-122L accepted only either a ¼" plug or a balanced/X-series, Latch, Rubber (XLR) input. Therefore, a Cardas RCA female-to-male XLR adaptor was used at the end of the analog test cables to connect to the Tascam US-122L. The analog test signals were recorded at a resolution of 24 bits at a sampling rate of 96 kHz. CubaseLE recording software was used, and the recorded signals saved as wave files on the computer.

The results were then analyzed for total harmonic distortion (THD), total harmonic distortion+noise (THD+N), Intermodulation Distortion (IMD), and signal-to-noise ratio (SNR), using SpectraPLUS software. The two tables below provide a summary of the results.

TABLE 1

−10 dB Amplitude Test

| −10dB | THD | THD + N | IMD | SNR |
|---|---|---|---|---|
| Standard Connector Cable | | | | |
| Sine Computer (Linear Phase Filter) | 0.03498% | 0.03610% | 0.2549% | 68.849 dB |
| Sine DAC (Minimum Phase Filter) | 0.01813% | 0.15582% | 0.2553% | 56.148 dB |
| Magnet Connector Cable | | | | |
| Sine Computer | 0.03505% | 0.03720% | 0.2559% | 68.589 dB |
| Sine DAC | 0.02014% | 0.15623% | 0.2557% | 56.124 dB |

TABLE 2

−3 dB Amplitude Test

| −3dB | THD | THD + N | IMD | SNR |
|---|---|---|---|---|
| Standard Connector Cable | | | | |
| Sine Computer (Linear Phase Filter) | 0.02181% | 0.02199% | 0.2554% | 73.157 dB |
| Magnet Connector Cable | | | | |
| Sine Computer | 0.01798% | 0.01842% | 0.2553% | 74.694 dB |

The test results appear to show a slight decrease in performance for the signal cable using the magnet center-pin at the −10 dB signal level. There was a slight increase in both THD and noise, plus a slight decrease in SNR. The differences were between 0.4% and 3% of the total THD/noise, and the SNR decreased by 0.26 dB. One potential hypothesis for this result is that the signal cable with the magnet center-pin may be allowing lower-level noise within the signal-generating computer to be transmitted through to the digital recorder. That is, the threshold for signal transmission for the cable with the magnet connector may be lower than for the cable with the standard non-magnet connector. Again, and regardless of the actual reason, the −10 dB signal level was determined to be too low to provide meaningful results.

The test results show a significant improvement in performance for the signal cable using the magnet center-pin at the −3 dB signal level. There was a decrease of approximately 20% for the THD/noise, and there was an increase of the SNR of approximately 1.54 dB. Further, the tests showed an absolute THD+noise reduction of approximately 20% when only the analog signal was changed. There generally would have been THD+noise generated by the signal computer and the Tascam US-122L recording device. There also would be expected to be small levels of THD+noise resulting from the adaptors, both from the computer and into the recording device. The THD+noise from these devices would have been consistent from one test to the other. Thus, the reduction in THD+noise of the signal cable by itself would be expected to have been greater than the measured 20%.

In summary, the results generally show that the use of a ferromagnetic conductor-based signal cable with a magnet center pin connector significantly increases the quality of analog signal transmission compared to a ferromagnetic conductor-based signal cable with a non-magnet center-pin connector.

Figure 6:
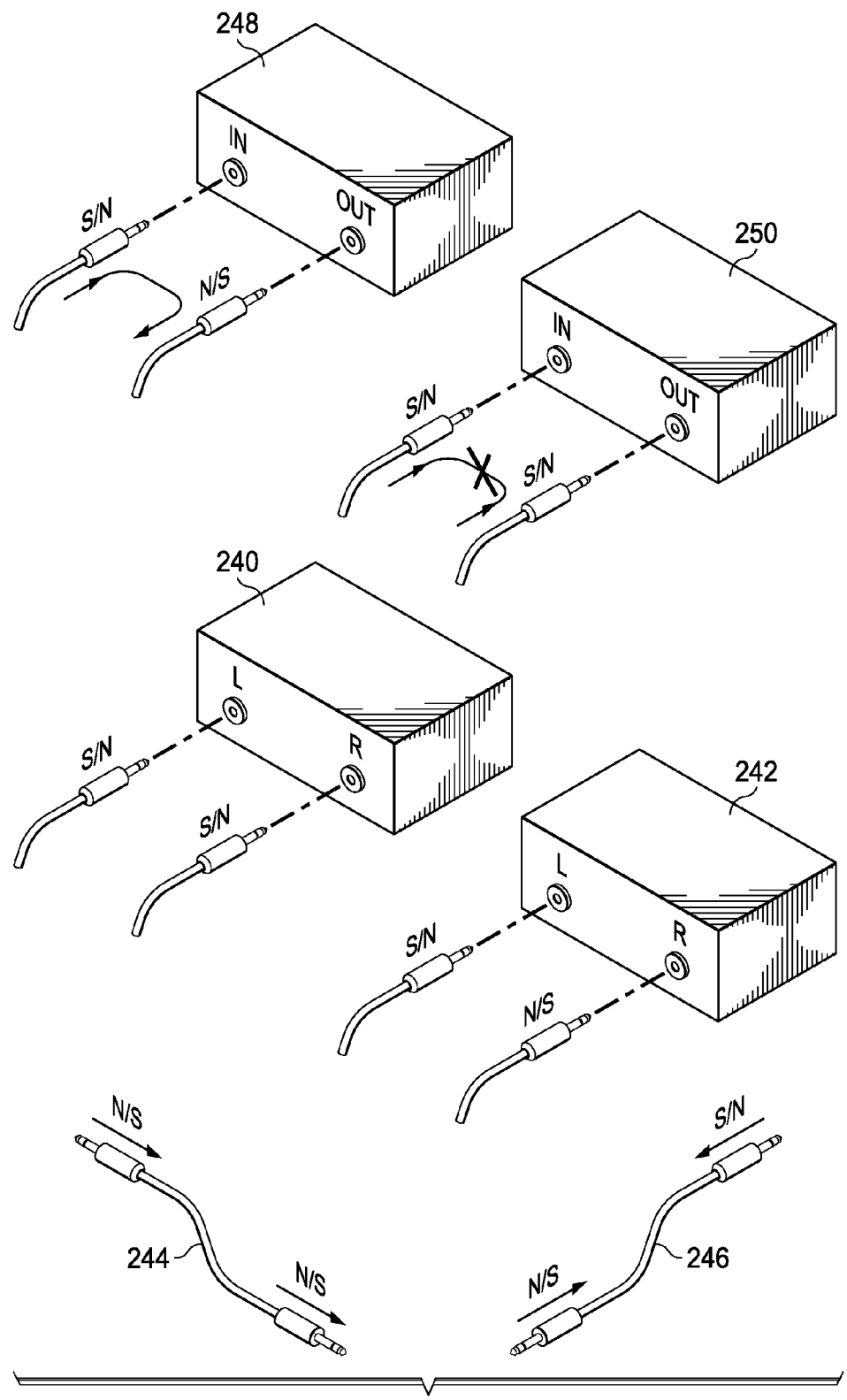
FIG. 6 is a block diagram of magnetic field orientations for various signal flow configurations.

FIG. 6 illustrates the different ways in which the polarity of the permanent magnets may be oriented in a system. In experimental observation, the orientation of the magnetic fields of the permanent magnets relative to each other within a system appeared to have an effect on signal quality. Observation has shown that in preferred embodiments, magnetic poles preferably are aligned with the direction of signal flow within a cable, between pairs of cables, and into and out of a device. Any combination of two or all three of these configurations also enhances the effect on signal quality.

For example, a tangible and desirable effect was created when left and right cables connecting to a compact disc (CD) player had matching magnetic poles at the cable end. That is, when plugging a set of RCA cables into a CD player, both cables preferably have either the same north or south poles on the active signals entering into the cable from the CD player. As shown in FIG. 6, CD player 240 has the north pole of the permanent magnet in each left and right cable connecting to the CD player. While this is the preferred configuration, positive results still were obtained when the polarities between cables did not match, as shown by the connection to CD player 242 in FIG. 6. In this case, the north pole of the left signal cable permanent magnet is connected to the CD player, while the south pole of the right signal cable permanent magnet is connected to the CD player.

Within a cable itself, observation also showed that it is preferable to have magnetic fields aligned with signal flow. Specifically, permanent magnets that are installed in a cable should follow north-south, north-south, along the cable length so that the cable has a consistent magnetic fields. As shown in FIG. 6, cable 244 preferably has a north pole of a permanent magnet at the tip of one connector, while the connector at the other end of the cable has the south pole of its permanent magnet at the tip. Here again, while this is the preferred magnetic field orientation, positive results still were obtained when the polarities were not aligned, as illustrated by cable 246 in FIG. 6. In this embodiment, the north poles of the permanent magnets in both connectors are at the tip of each connector.

The same effect was observed between inputs and outputs on a device, or would function similarly if two cables were connected to each other. That is, it is preferable to have the magnetic fields aligned from the input to a device through to the output of the device. Specifically, permanent magnets that are installed in cables should follow north-south, north-south from input to output of a device. As shown in FIG. 6, the cable connected to the input to device 248 has the north pole of a permanent magnet at the tip of its connector, while the cable connected to the output of device 248 has the south pole of its permanent magnet at the tip of its connector. Once again, while this is the preferred magnetic field orientation, positive results still were obtained when the polarities were not aligned, as illustrated by the cable connections to device 250 in FIG. 6. In this embodiment, the north poles of the permanent magnets in both connectors of the input and output cables are at the tip of each connector.

In some embodiments, the specific selection of north-south, north-south flow or south-north, south-north flow generally does not matter, but once a given orientation is selected, it is preferable to follow this orientation throughout a system, amongst signals traveling in the same direction within a cable, from connector to connector in a cable, from input to output in a device, and amongst cables carrying different signal components (e.g., component video). In other embodiments, e.g., in the northern hemisphere with a north magnetic pole, it may be preferable for the last magnetic pole introduced to be south. Thus a system may start with a north pole at a CD player and have south at an amplifier, etc. Systems in the southern hemisphere may use the opposite orientation.

For signals that travel in opposite directions, such as power and neutral/ground in a power connector/cable, or the positive and negative signals for a speaker connection/cable, it is preferable to have the magnetic fields oriented in the direction of signal flow, which for these signals is in opposite physical directions for the oppositely traveling signals. Thus, in a speaker cable with positive and negative signal lines, a permanent magnet on the positive signal may have its north pole oriented toward the speaker, while the permanent magnet on the negative signal may have its south pole oriented toward the speaker. Alternatively, a permanent magnet on the positive signal may have its south pole oriented toward the speaker, while the permanent magnet on the negative signal may have its north pole oriented toward the speaker. The negative signal line for a speaker cable generally may be regarded as a ground line. Again, beneficial results still were obtained even when orientations of the permanent magnets were not aligned in this manner.

It also is preferable to align the magnetic fields of permanent magnets in connectors that mate with each other. In other words, a female connector having a permanent magnet and installed on an electronic device may have a south pole disposed at its tip, with the north pole disposed toward the circuitry in the device. In a preferred embodiment, a cable having a male connector connected to this female connector should then have the north pole of its permanent magnet disposed toward the tip of the connector. This way, the magnetic field of the male connector is aligned with the magnetic field of the female connector. For example, a pin may comprise nickel and a socket tube may comprise neodymium. The magnets should attract as the signal goes through, and may help to lower internal vibrations at the pin/socket interface.

Experiments were conducted on other types of connectors as well. For example, magnetic conductors were used for the active signal connections for a low level analog signal from a phono cartridge at 0.5 volts output. Signal quality was improved for these signals as well. As another example, video connections also were tested, in one instance utilizing cables and connectors connecting a DVD player to an a liquid crystal display (LCD) television (TV). Enhanced picture brightness, enhanced color detail and color definition all were observed. Overall picture quality was improved.

Figure 7:
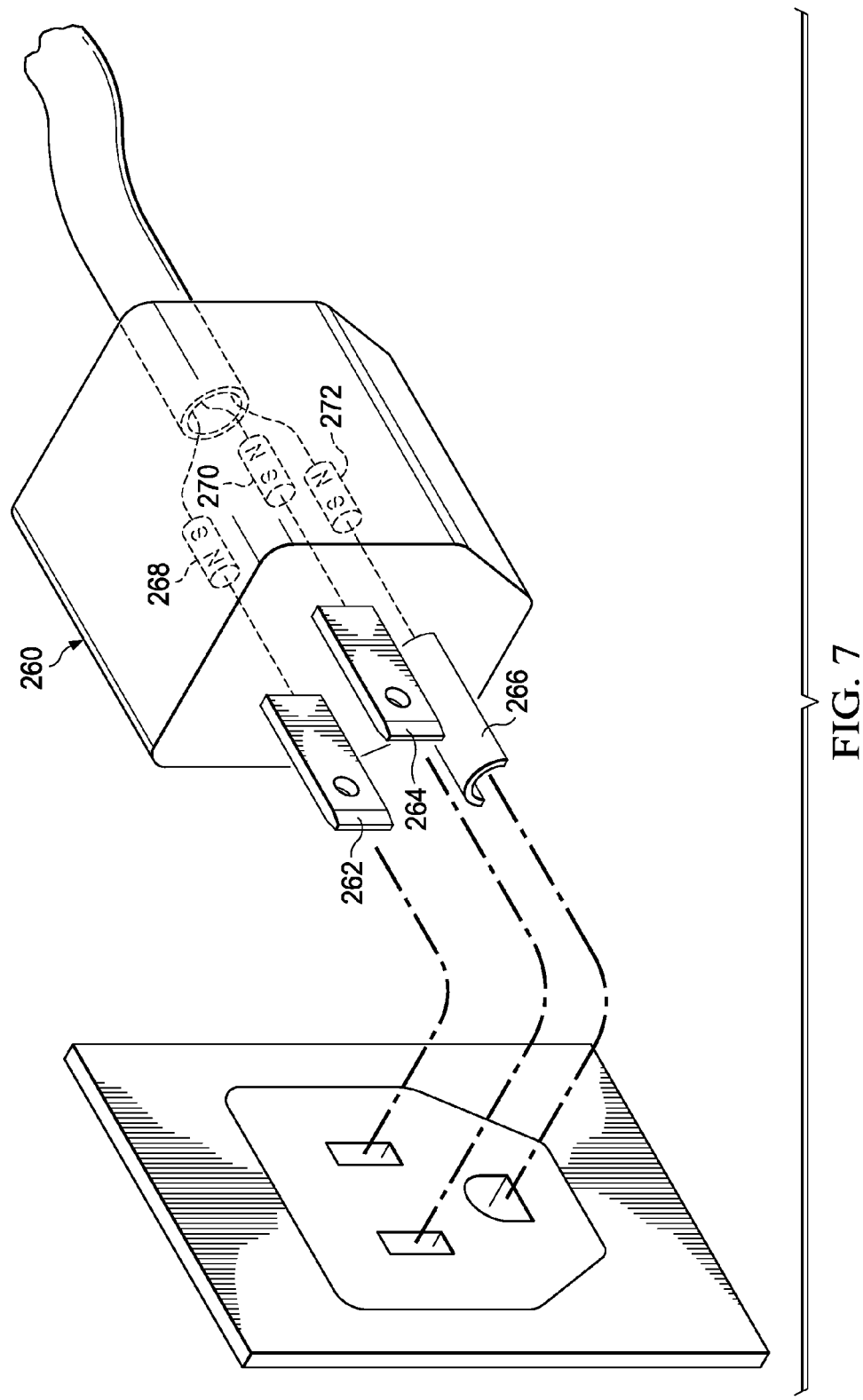
FIG. 7 is a diagram of a power connector utilizing permanent magnets.

Experiments also were conducted in installing permanent magnets in power cables, such as by attaching them to the wire conductors before terminating the conductors to the spade connections in the power connectors. These experiments also yielded positive results when applied to electronic devices. FIG. 7 illustrates a 120 volt AC electrical plug 260 with permanent magnets installed inside the plug in the circuit paths of the power, neutral and ground signals. In plug 260, line or hot pin 262 is connected to permanent magnet 268 in a north-south orientation. Return or neutral pin 264 and ground pin 266 are connected to permanent magnets 270 and 272, respectively, in a south-north configuration, opposite to the orientation of the permanent magnet for line pin 262. In configurations where there is no separate ground line, the return line may be considered a ground line, and the return pin a ground pin.

Alternatively, as with all embodiments disclosed herein, all the magnets may be reversed so that the poles are oriented in the opposite directions from those shown in the figure. As another alternative, the orientations of the magnetic fields for each pin may have any other combination of orientations, such as all being aligned with the same poles oriented toward the tip of the plug pins. Other power related connectors that may have permanent magnets installed include AC and direct current (DC) power plugs (such standard 15 amp power cable ends), power adapter plugs, power supply DC connectors, power lugs, power connectors, breaker lugs, and the like.

Based on experimental observations, connectors utilizing permanent magnets in the active signal path would enhance any electrical connection. These include many connectors well known to those of ordinary skill in the art, including audio, video, communication, radio frequency (RF), computer connectors and cables, and combinations thereof. These include RCA connectors, balanced connectors, XLR connectors, Bayonet Neill-Concelman (BNC) connectors, Syndicat des Constructeurs d'Appareils Radiorécepteurs et Téléviseurs (SCART), Sony/Philips Digital Interconnect Format (S/PDIF), and coaxial digital audio. Also included are TSR tip ring sleeve (TRS) jacks and plugs, such as 1½ inch microphone jacks and plugs, phono jacks and plugs, ¼ inch jacks and plugs, ⅛ inch headphone jacks and plugs, mini jacks and plugs, 1/16 inch jacks and plugs (plugs and jacks may be mono or stereo). Speaker connections such as S-way binding post connections, other binding posts and adapters, spade terminals, ring terminals, banana plugs etc. also may be included. Many video signals, such as composite video, component video, S-video, all high-definition multimedia interface (HDMI) type connectors, and video graphics array (VGA) connectors would benefit from utilizing permanent magnets in the active signal path.

Many computer and other electronic connections may utilize this technology, including all types of universal serial bus (USB) connections, all types of small computer system interface (SCSI) connections, IDC50, CN50, DB25, DH68, HD68, serial advanced technology attachment (SATA), external SATA (ESATA), HDI30, HPNC50, redundant array of inexpensive disks (RAID), DB50, DB37, integrated drive electronics (IDE), HDN60, HDCN60, FireWire, ICE3 320, digital video interface (DVI), peripheral component interconnect (PCI), industry standard architecture (ISA), Institute of Electrical and Electronics Engineers (IEEE) 1394, International Business Machines Corporation (IBM) personal computer (PC) parallel port, peripheral component interconnect express (PCI-E), micro channel architecture (MCA), Personal Computer Memory Card International Association (PCMCIA), tip ring sleeve (TRS), Deutsches Institut für Normung (DIN), Mini DIN, and Audio Engineering Society/European Broadcasting Union (AES/EBU).

A variety of other connectors include RF coaxial, RG-6 coax connectors, F-Type connectors, National Electrical Manufacturers Association (NEMA) type plugs, TRS, 2-pin, 3-pin and 4-pin connectors, snap-in connectors, friction connectors, magnetically held connectors, DE-9, 8P8C, 4 mm plug, d-subminiature, RJ-XX connectors such as RJ-11 and RJ-45, terminal blocks, crimp on connections, connectors for resistors, transistors, diodes, capacitors, anodes, cathodes, shielded compact ribbon (SCR), and telephone and communication cable ends (Ethernet and other network cables). Permanent magnet clips or adaptors may be installed on battery charger or spark plug terminals. Permanent magnet leads or contacts may be installed in switches (e.g., for light bulb circuits) and wire termination blocks, etc., or permanent magnet adaptors may be installed in light bulb sockets.

As can be seen, there are a vast number and variety of electrical connections, only some of which are listed above. All of these connectors and connections may benefit from the magnetic principles described herein. Furthermore, multiple pin connections could be established using each magnetic pin not only to conduct a signal, but also to mechanically attach connectors to each other through magnetic forces. This type of physical magnetic connection also may be combined with a mechanical connection for added strength. For example, binding posts, spades, bananas and other push in connectors may be replaced with permanent magnets that attract to each other for a mechanical hold as well as the benefit of the magnetically-enhanced electrical signal transfer.

Figure 8:
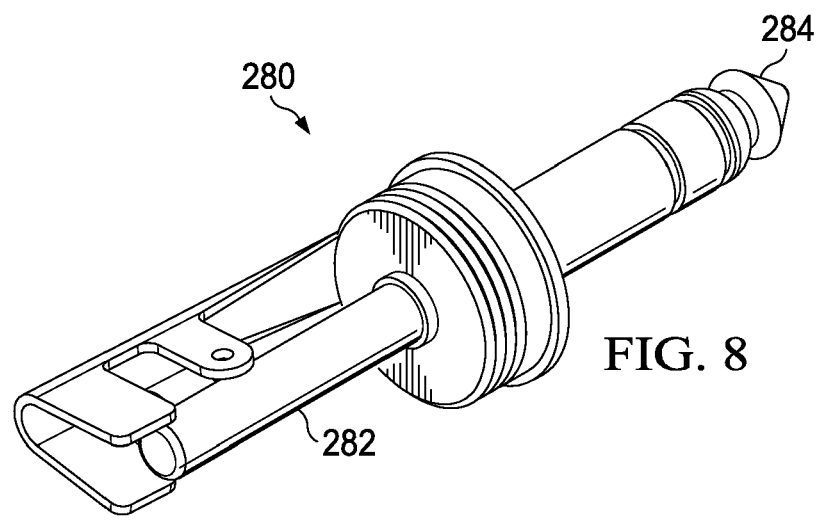
FIG. 8 is a diagram of a connector having a permanent magnet attached to the active signal pin.

As discussed above with respect to 120 volt power plugs, for some connectors and their pins and sockets, it may be more practical to place the permanent magnet in the active signal path, but disposed back from the contact, e.g., pin or socket, itself due to space or other mechanical considerations. The permanent magnet may be disposed in the connector body, or it may be disposed in a cable that is attached to the connector. As an example, FIG. 8 illustrates a permanent magnet 282 attached to the active signal pin 284 of a ¼ inch plug. The active signal wire in a cable may then be attached to the permanent magnet 282. Other components of connector 280 are similar to those of the connector shown in FIG. 5. Depending on the specific application, the shape of the magnet may be a cylinder, a cube, a rectangular prism, a general prism, and the like.

Figure 9:
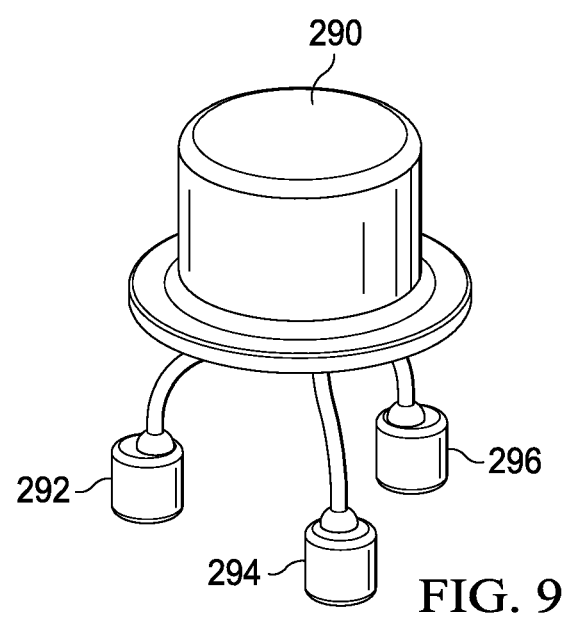
FIG. 9 is a diagram of a transistor having permanent magnets attached to the signal leads.

In another application, permanent magnet leads may be built into or attached to capacitors, resistors, inductors, transistors, transformers, integrated circuits, and other electronic components. As an example, FIG. 9 illustrates a transistor package 290 having permanent magnets soldered to each signal lead, collector 292, base 294 and emitter 296. The magnets may form the leads themselves, or as here, may be attached to already-existing leads. Alternatively, the magnets may be incorporated inside the package of the component.

While not required, as with other embodiments magnetic field orientation preferably follows signal flow. For an NPN bipolar transistor, the base and collector pin magnets are oriented, for example, north-south, while the emitter pin magnet is oriented south-north. For a PNP bipolar transistor, the base and emitter pin magnets are oriented, for example, north-south, while the collector pin magnet is oriented south-north. For an n-type field effect transistor, the gate and source pin magnets are oriented, for example, north-south, while the drain pin magnet is oriented south-north. For a p-type field effect transistor, the gate and drain pin magnets are oriented, for example, north-south, while the source pin magnet is oriented south-north.

Permanent magnets may be used in a similar manner with components with fewer leads, such as capacitors, resistors and inductors, or with more leads, such as transformers and integrated circuit packages. Alternatively or in addition, the sockets (e.g., on a printed circuit board) that accept these components may incorporate permanent magnets in the active signal paths.

The electrical connections described herein generally use ferromagnetic material as part of the conductive path for an electrical signal, allowing electrical energy to flow through permanent magnets. Achieving a strong magnetic field generally is desirable, and the magnetic material generally should have a high magnetic permeability. A stronger magnetic field may be generated by, for example, using a magnet with a larger volume, a larger cross-section, a longer length, or a higher Maximum Energy Product, $BH_{max}$. $BH_{max}$ measures magnetic field strength at the point of maximum energy product of a magnetic material, and is measured in MegaGauss-Oersteds (MGOe).

A wide array of materials with varying magnetic strength may be used as the permanent magnets in the disclosed embodiments. As examples, $Nd_2Fe_{14}B$ magnets generally have a $BH_{max}$ in the range of about 8 to 53 MGOe, $Sm_1Co_5$ or $Sm_2Co_{17}$ magnets generally have a $BH_{max}$ in the range of about 14 to 32 MGOe, Alnico magnets generally have a $BH_{max}$ in the range of about 1 to 10 MGOe, and ferrite magnets such as $SrO-6(Fe_2O_3)$ (strontium hexaferrite) or $BaO-6(Fe_2O_3)$ (barium hexaferrite) generally have a $BH_{max}$ in the range of about 1 to 5 MGOe.

Experiments were conducted using N3x and N4x grade neodymium permanent magnets in the active signal path. Generally, the higher the material grade, the stronger the magnet field of the material. Preferably, a material or combination of materials used has both high magnetic field strength and high electrical conductivity. These parameters may be traded off for each other as well. For example, a lower conductivity material may be acceptable if it has a higher magnetic field strength. Likewise, a lower magnetic field strength material may be acceptable if it has a higher electrical conductivity.

Rare earth permanent magnets generally have relatively strong magnetic fields compared to non-rare earth permanent magnets.

Rare earth elements are a family of elements with atomic numbers from 57 to 71, plus 21 and 39, and specifically are lanthanum, cerium, praseodymium, neodymium, samarium, europium, gadolinium, terbium, dysprosium, holmium, erbium, thulium, ytterbium, lutetium, scandium, and yttrium. Rare earth magnets include rare earth elements and their alloys, such as neodymium and neodymium-based alloys, samarium and samarium-based alloys, praseodymium and praseodymium-based alloys, gadolinium and gadolinium-based alloys, dysprosium and dysprosium-based alloys. Commonly used rare earth magnets include neodymium (Nd-FeB, or NIB) magnets and samarium cobalt (SmCo) magnets.

Sintered neodymium magnets with grades from N3x to N4x to N5x are preferable for applications benefiting from high magnetic field strength. These include N35, N40, N42, N48, N50 and N52 grades, for example. The specific magnet used for a particular application may depend on tradeoffs between parameters such as magnetic field strength, cost, and availability.

Another type of neodymium magnet that may be used is a bonded neodymium magnet. While bonded materials generally are not as powerful as sintered materials, bonded neodymium magnets are quite strong and would still work well. Sintered and bonded samarium cobalt magnets generally have a high Curie temperature, resist corrosion well and may be used with or without surface coatings, but generally are less powerful than neodymium magnets.

Non-rare earth magnets include iron and iron-based alloys (such as steel, iron alloyed with carbon that also may comprise other elements such as manganese, chromium, vanadium, molybdenum, nickel and tungsten), nickel and nickel-based alloys, permalloy (nickel iron alloy that also may comprise molybdenum), and cobalt and cobalt-based alloys.

Alnico (AlNiCo) magnets generally are less powerful than rare-earth magnets, but typically are easily machined and can be made into many different shapes, allowing for use with a wide range of connector shapes and sizes. Alnico alloys typically comprise 8-12% Al, 15-26% Ni, 5-24% Co, up to 6% Cu, up to 1% Ti, with the balance being Fe.

Mu-metal is a nickel-iron alloy (approximately 75% nickel, 15% iron, plus copper and molybdenum) that has very high magnetic permeability. Mu-metal may be useful in some applications because of its high magnetic permeability and conductivity.

Ferrite magnets such as strontium ferrite and barium ferrite magnets generally have the lowest magnetic field strength, and may be usable but are less preferred than the other, stronger permanent magnet materials.

Some permanent magnets may comprise materials that are more brittle, less conductive, or more corrosion resistant than desired for a given application. Therefore, magnets may be plated or coated to increase physical strength, corrosion resistance, conductivity, or any combination thereof. Conductive metals, such as copper, nickel, gold, silver, or any combination thereof, may be used to coat permanent magnets. Nickel benefits by being ferromagnetic. Copper and silver both are highly conductive. Gold is both quite conductive and has high corrosion resistance.

Magnets may be plated in layers such as combinations of the above, or nickel-nickel, copper-nickel or nickel-copper-nickel. Black nickel, zinc, aluminum and other conductive metals and metal alloys may be possible as well.

As an example, pins utilized in various experiments were nickel plated neodymium N40 grade magnets. As nickel is less conductive than some other metals, plating alternatively or additionally with highly conductive metals such as gold, copper, silver, and the like, may increase conductivity.

One embodiment coating selected from the various materials comprises nickel for mechanical strength, copper for conductivity and smooth quality plating, and gold plating on the outside to protect against corrosion and further aid in conductivity. These coatings may be used with sintered neodymium magnet cores of N30 grade or higher, or more preferably N40 grade or higher, or more preferably N50 grade or higher, for various applications.

Figure 10:
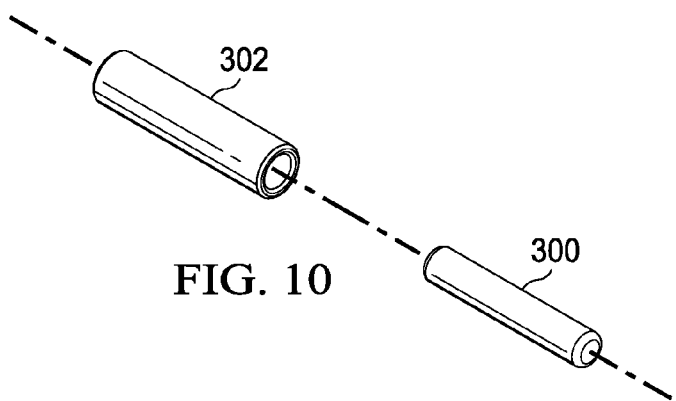
FIG. 10 is a diagram of a disassembled permanent magnet and its conductive sleeve.
Figure 11:
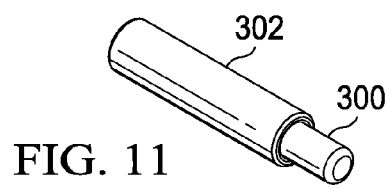
FIG. 11 is a diagram of a partially assembled permanent magnet and its conductive sleeve.

Another approach to increasing physical strength and potentially increasing conductivity and corrosion protection is to use a sleeve surrounding a permanent magnet, whether the permanent magnet is installed as a connector pin, within a connector, within a cable, or within an electronic device. FIGS. 10 and 11 illustrate an example of an inner core permanent magnet inner core 300 and an outer sleeve 302. In FIG. 10 the permanent magnet 300 and sleeve 302 are separated from each other, and in FIG. 11 the permanent magnet is shown partially installed in sleeve 302. If the permanent magnet is not installed as a connection point, then sleeve 302 may be a non-conductive material such as plastic. Preferably, sleeve 302 is a conductive material such as copper or the other conductive materials listed above. Sleeve 302 may additionally or alternatively be a ferromagnetic material such as nickel or the other ferromagnetic materials listed above. In other embodiments, the permanent magnet may be the outer sleeve and the other material (e.g., copper) may be the inner core.

In view of the wide variety of applications for replacing traditional connector pins and receptors with permanent magnets, or for inserting a permanent magnet in active signal circuit paths, it also can be beneficial to use a permanent magnet to magnetically charge another material that is making the connection or is part of the circuit path. For example, a permanent magnet attached to the end of a small nickel pin or socket generally provides both a stronger pin or socket for mechanical purposes and the benefit of an applied magnetic field. For this type of application, a high electrical conductivity coupled with a high magnetic permeability may provide synergistic benefits.

It was observed in further experimentation that using a non-permanent-magnet ferromagnetic material, such as a steel center core conductor, further enhanced the beneficial effects of using a permanent magnet in the active signal path. Audible and visual benefits were observed when using a conductor with a steel core. The ferromagnetic properties of the steel conductor cable generally allowed the magnetic effects to extend beyond the permanent magnet and perhaps effectively run through the entire cable, with the steel conductor connecting permanent magnet pins on either end of the cable.

Preferably the ferromagnetic conductor material is a hard ferroelectric material, but also may be a soft ferroelectric material. A ferromagnetic material with high magnetic permeability or a ferromagnetic material with high conductivity, or both, may offer a stronger effect. Various ferromagnetic materials have different values for resistivity. By way of example for relative comparison, cobalt may have a resistivity in the range of about 62.4 nano-ohms per meter, nickel may have a resistivity in the range of about 69.3 nano-ohms per meter, iron may have a resistivity in the range of about 96.1 nano-ohms per meter, steel may have a resistivity in the range of about 150 nano-ohms per meter, and stainless steel may have a resistivity in the range of about 700 nano-ohms per meter.

Figure 12:
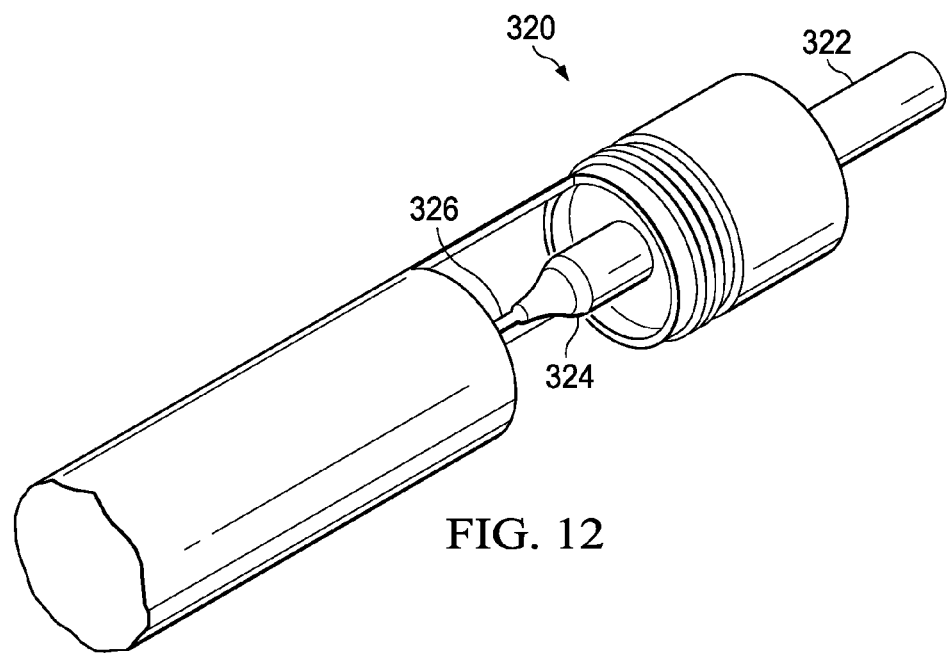
FIG. 12 is a diagram of a cable having a ferromagnetic conductor attached to a connector with a permanent magnet active signal pin.

FIG. 12 illustrates an RCA cable 320 having a permanent magnet center pin 322 soldered 324 to a steel core wire 326. Steel provides sufficient conductivity, although there are materials that are more magnetically permeable and more conductive. Nickel, for example, may be utilized to increase conductivity and magnetic permeability. Accordingly, nickel may be a preferred material for interconnects, speaker cables and specialty power cords based on its cost and other characteristics.

Steel core wire 326 was coated with copper and silver to increase conductivity and corrosion resistance. Silver is a good outer coating because silver oxide generally remains almost as conductive as silver. In test observations it was noted that the steel center core improved the sonic performance of an audio system more than the same gauge size silver or copper conductor. It appears that the permanent magnet connectors were at least partially or completely magnetizing the steel core wire 326, thereby enhancing the effect observed when using a permanent magnet in conjunction with a non-ferromagnetic material in an electrical signal path. The ferromagnetic conductor may be used in conjunction with any of the permanent magnet embodiments disclosed hereinabove.

Furthermore, printed circuit board or printed wiring board traces may be made with ferromagnetic materials, such as nickel, cobalt or mu-metal, and may have one or more permanent magnets installed throughout the board in order to magnetize the traces on the board. These embodiments may be combined with permanent magnet or ferromagnetic material leads on mounted components such as resistors, capacitors, inductors, transistors, integrated circuits, and the like. Further detail on circuit board embodiments is provided hereinbelow.

Figure 13:
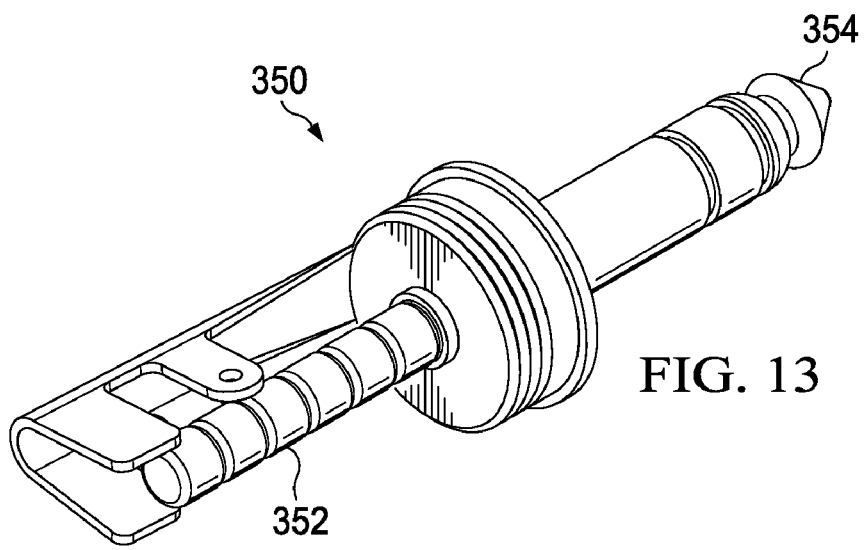
FIG. 13 is a diagram of a connector having a permanent magnet stack attached to the active signal pin.

In another area of experimentation, multiple permanent magnets in a stacked configuration were utilized in place of the single magnet per signal embodiments disclosed herein. In stacking permanent magnets together, as the north and south poles of two magnets attract each other, the magnetic attraction between the magnets causes them to fall into alignment, for example as illustrated in FIG. 13, making for a stack of permanent magnets that resembles a conductive rod. FIG. 13 illustrates ¼ inch plug 350 having a stacked permanent magnets 352 attached to the active signal pin 354. The active signal wire in a cable may be attached to the permanent magnet stack 352. Other components of connector 350 are similar to those of the connector shown in FIG. 8.

A stacked magnet configuration may benefit any electrical/electronic connector, cable, device, and the like, such as those disclosed herein. Stacked permanent magnets, for example, appear to lower losses, increase performance of audio and video circuits, and increase energy transfer. Furthermore, increasing the quantity of north-south pole changes in the stack (i.e., the number of magnets in the stack) generally appears to improve the general flow of electricity and power/ data transfer over embodiments with fewer stacked magnets. The number of permanent magnets may be increased by adding more magnets to the stack, and the overall stack size may be kept to a reasonable size by utilizing thinner magnets.

Figure 14:
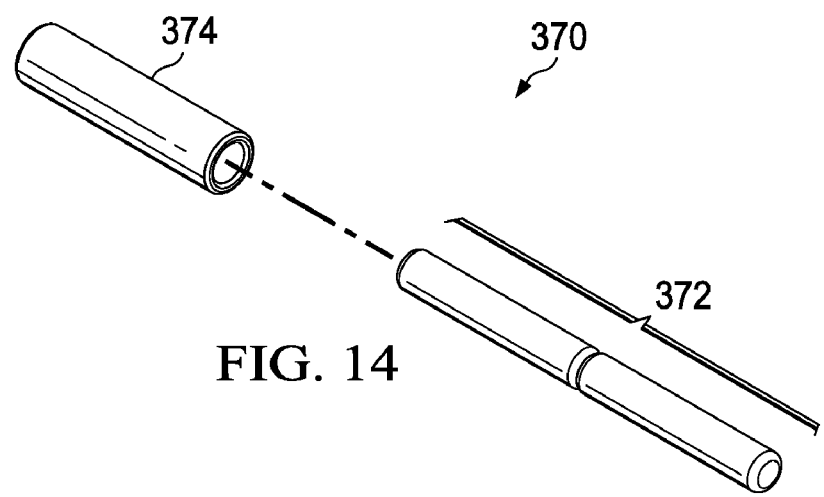
FIG. 14 is a diagram of a permanent magnet stack and a partial conductive sleeve.

As an alternative to the magnet stack being connected to the connector pin as shown in FIG. 13, a magnet stack may be used for the connection itself. As an example, a magnet stack wrapped in a nickel sleeve serving as a pin in a connector generally would offer the benefits of stacked magnets but as a connection. FIG. 14 illustrates sleeved stacked magnet pin 370. Permanent magnet stack 372 is contained within a copper sleeve 374. In this case the sleeve is shorter than the combined length of the magnet stack, but alternatively the sleeve may be the same length as the stack or the sleeve may be longer than the stack.

A stacked magnet configuration generally offers added benefits over a single permanent magnet of equal size and strength. As with increasing conductivity, increasing magnetic field strength, and increasing cross-section, increasing the number magnets in a stack generally increases performance. Generally, the larger the number of magnets in a stack, the wider the cross-section, the longer the length of the stack, the higher the material conductivity, and the higher the material magnetic field strength or the stronger the individual magnets, the greater the benefit.

Figure 15:
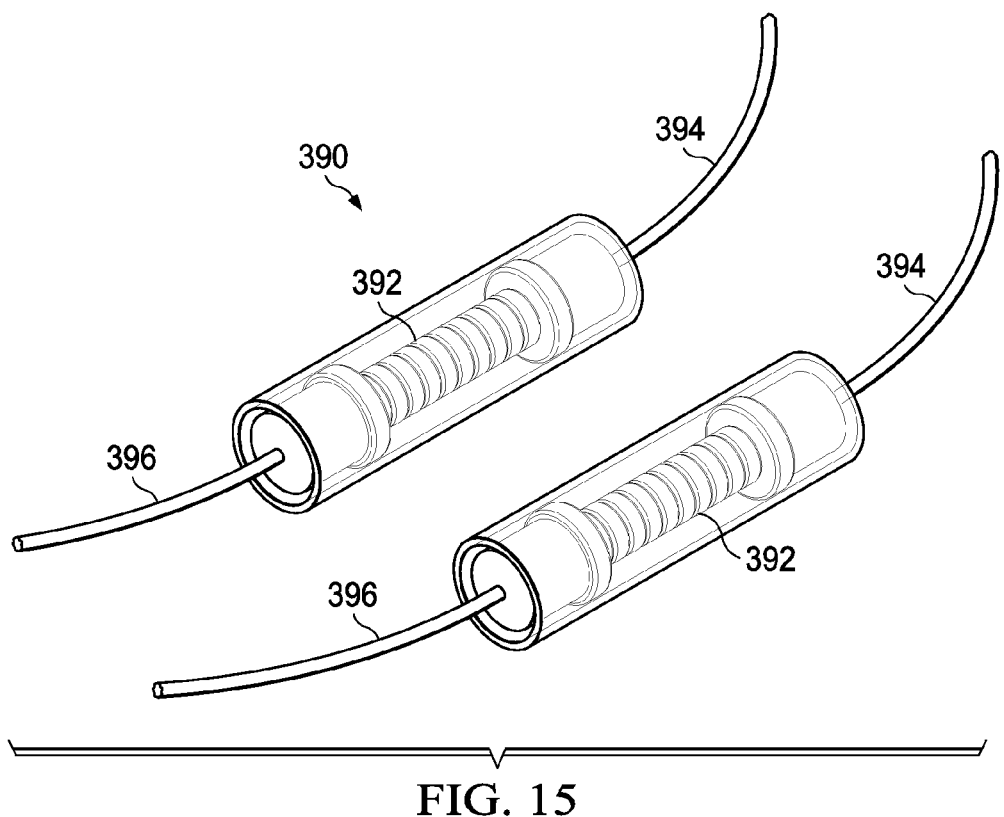
FIG. 15 is a diagram of a cable comprising a permanent magnet stack disposed in the active signal path.

FIG. 15 illustrates another alternative for placement of the magnet stack. Speaker cables 390 each contain a magnet stack 392 disposed in the cable itself, instead of being disposed as a connector pin or in the connector. One cable side 394 is attached to one end of magnet stack 392, and the other cable side 396 is attached to the other end of magnet stack 392. The magnet stack may be used on the positive speaker cable, the negative speaker cable, or both. The magnet stack may be disposed in a plastic sheath as shown, or may be built into the cable wiring, and may be disposed anywhere along the length of the cable.

Figure 16:
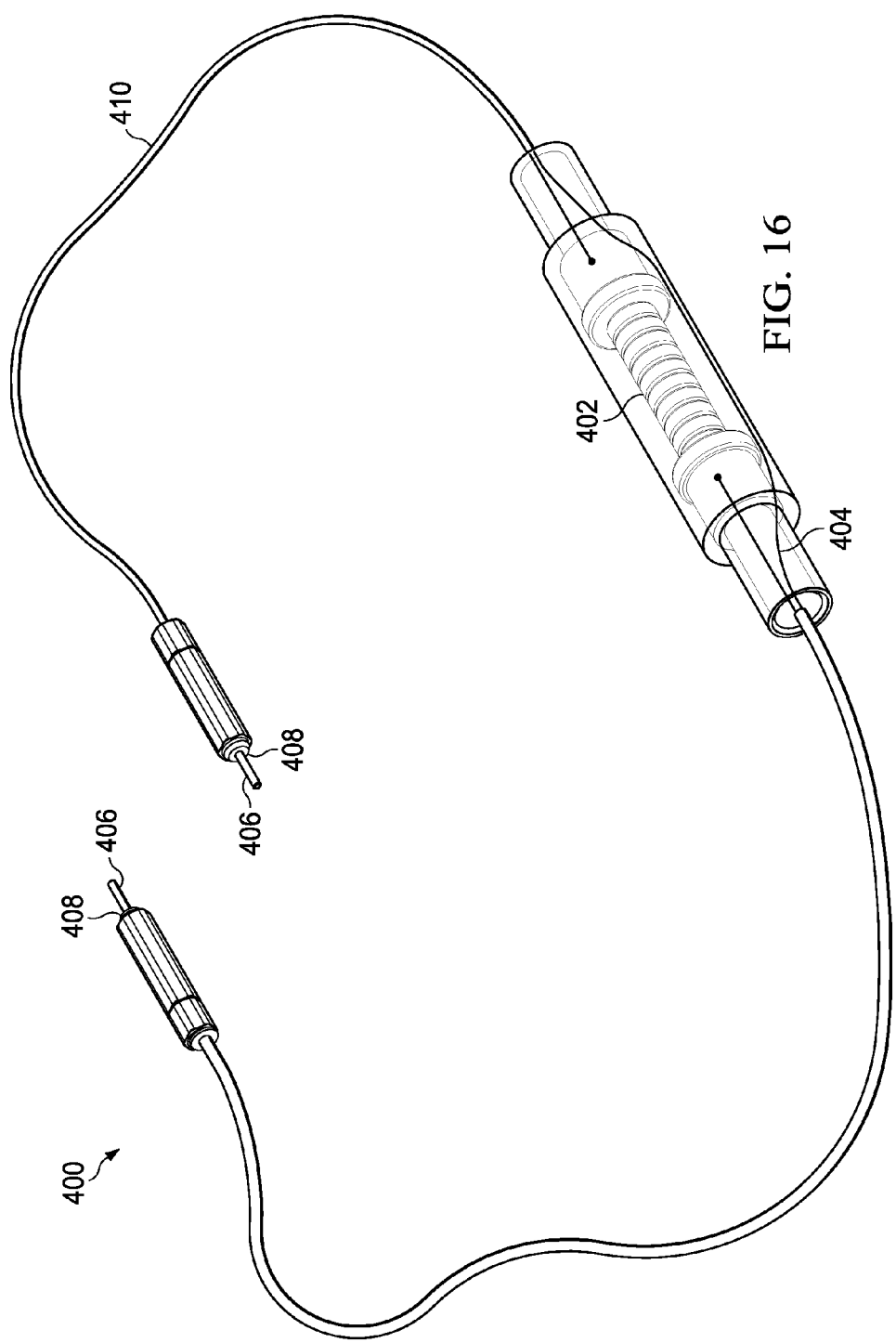
FIG. 16 is a diagram of an interconnect cable having a permanent magnet stack disposed in the active signal path.

FIG. 16 illustrates an interconnect cable 400 having a magnet stack 402 disposed in the active signal path of the cable. The magnet stack 402 is electrically connected to connector pins 406. In this embodiment, the ground lead 404 directly connects ground rings 408, and is not connected to any magnets. Alternatively, the ground lead may have a single magnet or magnet stack disposed in the cabling. Furthermore, in this embodiment the pins 406 of the connectors also are permanent magnets in themselves. As with other embodiments, the poles of the magnets may be in any orientation, but preferably are aligned so that, for example, a north-south pole orientation of the pin on one connector leads to a north-south pole orientation of the magnet stack, which then connects to a north-south pole orientation of the other pin. Thus, the first pin has a north pole at its tip, while the second pin has a south pole at its tip. Insulating sheath 410 electrically insulates the wires from the environment. In other embodiments, the sheath also may encompass the permanent magnet stack.

Figure 17A:
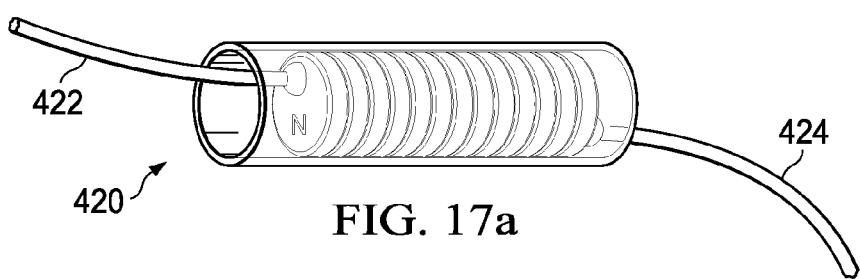
FIG. 17a is a schematic diagram of a cable comprising a permanent magnet stack.
Figure 17B:
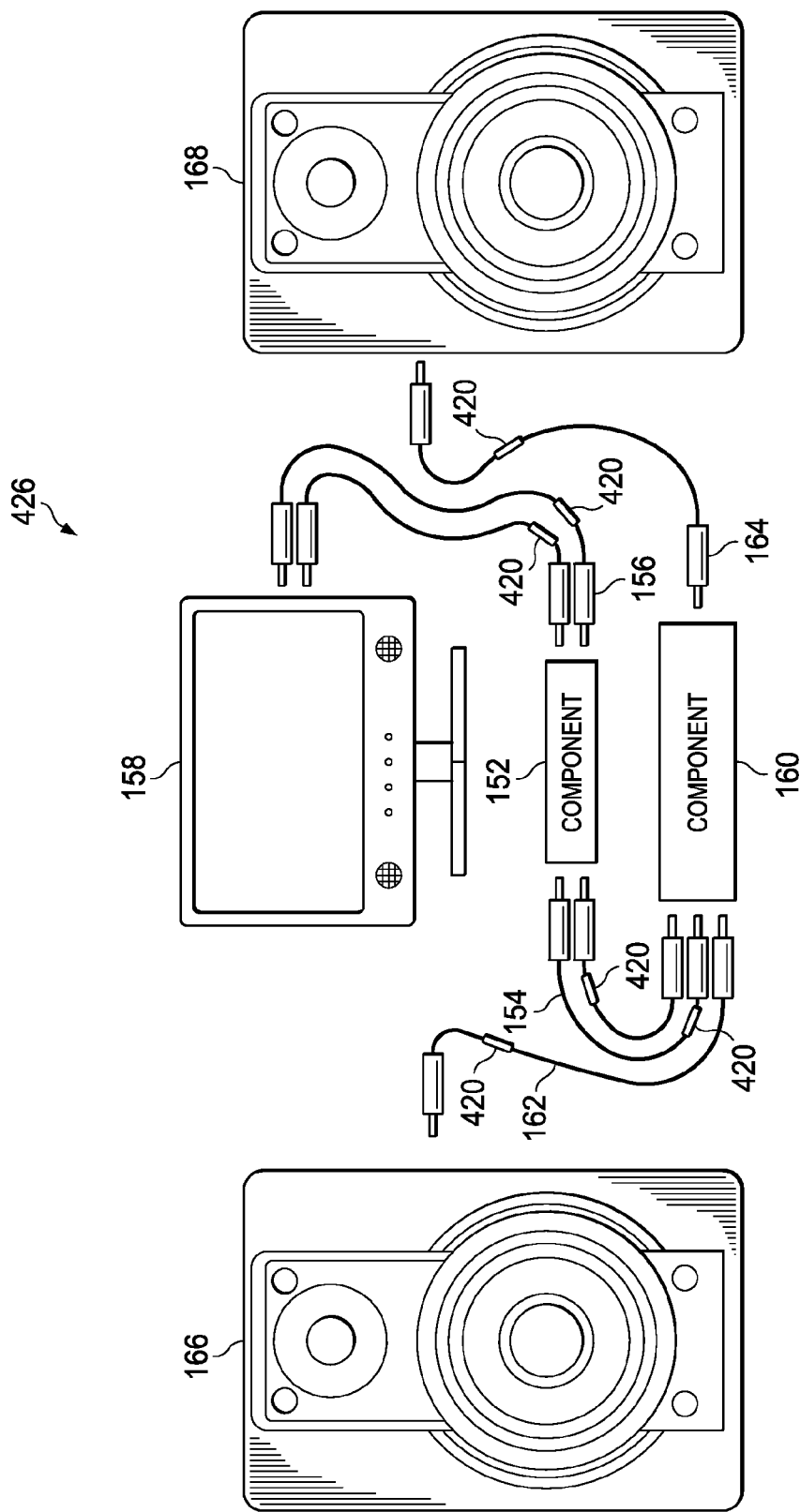
FIG. 17b is a block diagram of an audio-video system having stacked magnet cables.

FIG. 17a illustrates a schematic diagram of a magnet stack connection. Utilized in cabling, magnet stack 420 has the north pole of an end magnet soldered to one cable side 422, and the south pole of the other end magnet soldered to the other cable side 424. Such magnet stacks may be utilized throughout a system, such as the audio-video system 430 shown in FIG. 17b. In system 426, magnet stacks 420 are shown disposed in interconnect cabling between components and in speaker cabling.

Figure 18:
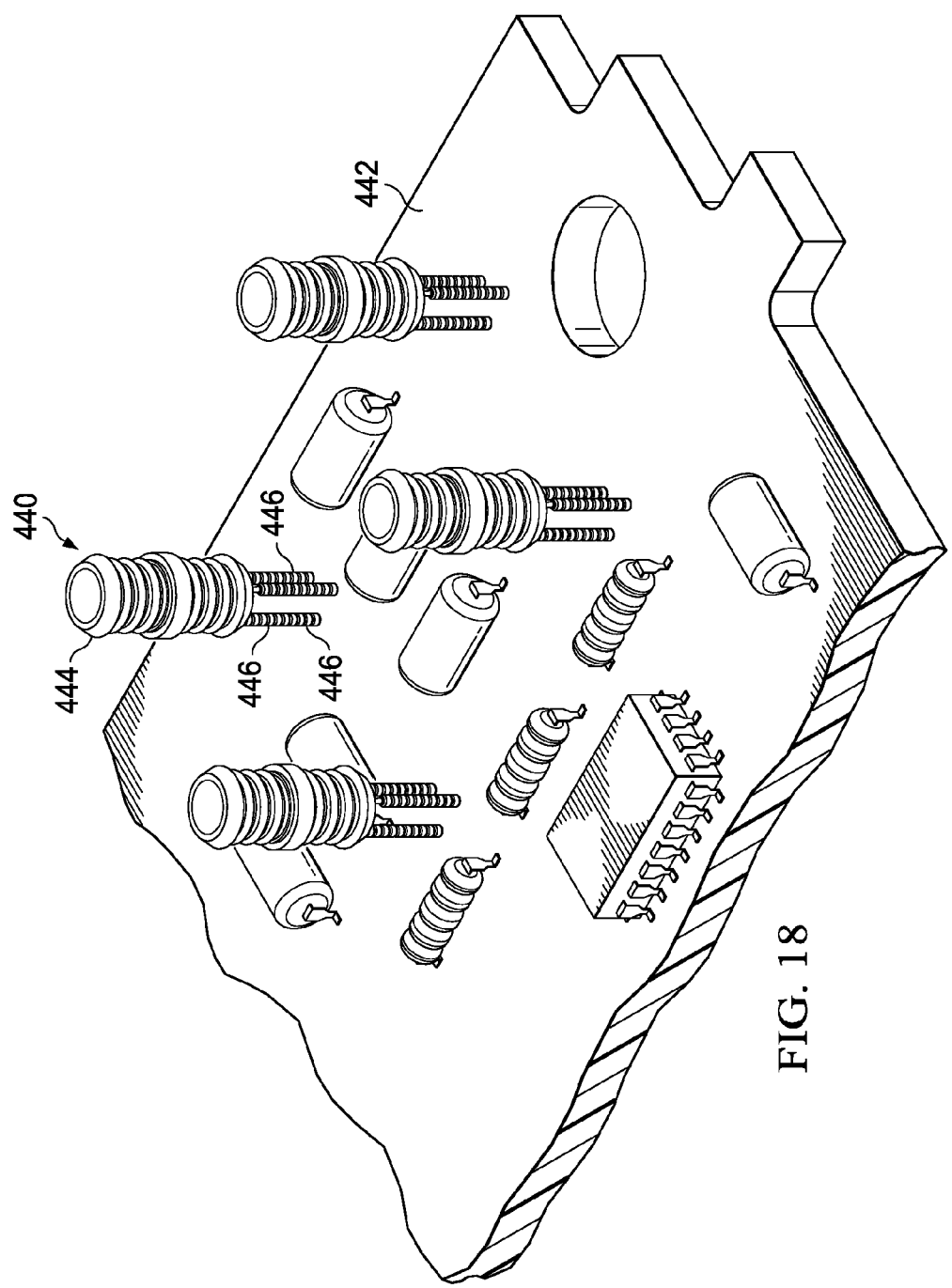
FIG. 18 is a diagram of a transistor having stacked magnets attached to the signal leads.

In other experiments, stacked magnet configurations were implemented with electronic components. Electronic components include transistors, resistors, capacitors, inductors, integrated circuits, and the like. FIG. 18 illustrates a transistor 440 disposed on a printed circuit board 442. Transistor 440 has a heat sink 444 attached to the transmitter case, and each of the transistor leads includes a permanent magnet stack 446. The poles and magnetic fields of the magnets may be oriented as described for the single permanent magnet embodiment, such that the magnets are oriented in with the signal flow. Alternatively, the magnet stacks may be built into the electronic component case or package, or may be implemented as part of the printed circuit board to which the component is attached.

Figure 19:
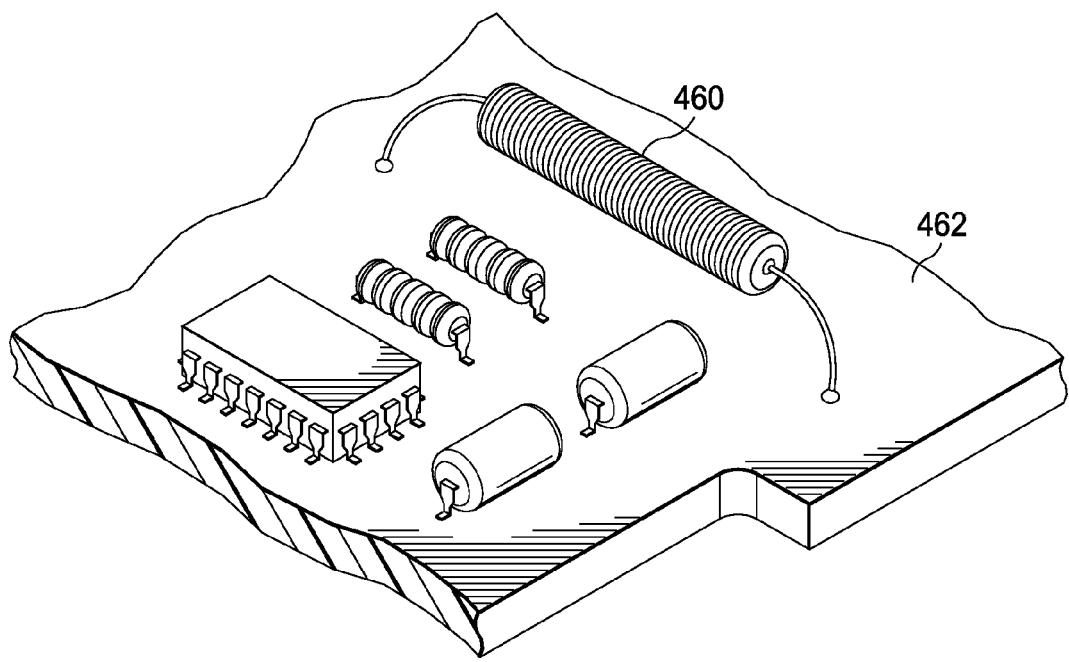
FIG. 19 is a diagram of a circuit board having a permanent magnet stack in an active signal path.

FIG. 19 illustrates an example of a printed circuit board (PCB) implementation. PCB 462 mechanically supports and electrically connects electronic components using conductive signal traces disposed on a non-conductive substrate. A PCB may components mounted on one or both sides, and may comprise multiple layers of conductive traces laminated between multiple dielectric substrates. The PCB generally is coated with a solder mask. Electronic components are soldered to the PCB via leads inserted into through-holes on the board, or surface mounted to conductive pads on the surfaces of the board. The PCB dielectric may be laminated from epoxy resin prepreg. Materials used for PCB dielectrics include woven-glass reinforced laminates, non-woven laminates, FR-4, FR-1 through FR-6, CEM-1 through CEM-4, and the like.

A permanent magnet stack 460 disposed on PCB 462. In this implementation, the magnet stack 460 is in the signal path of an input to the board 462. The magnet stack may be protected by an insulating sheath, or may be disposed in a receptacle or housing attached (e.g., soldered) to the board 462. The conductive traces may comprise copper, or they may comprise a ferromagnetic material, such as nickel, cobalt, mu-metal, and the like. The magnetic stack may interact with the ferromagnetic traces to magnetize the traces. Alternatively, multiple magnet stacks, a single magnet, multiple single magnets, or combinations thereof may be implemented in different applications.

Figure 20:
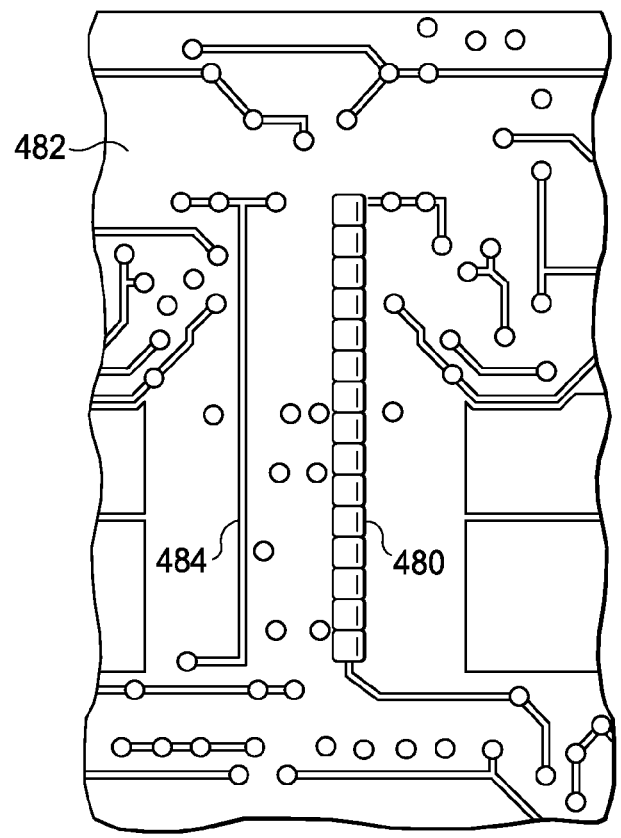
FIG. 20 is a diagram of a circuit board having a permanent magnet stack as one of the signal paths on the board.

FIG. 20 illustrates another embodiment wherein stacked permanent magnets 480 are used in place of a circuit trace on circuit board 482. That is, instead of two points of connection being connected with a trace, such as trace 484, two connection points are electrically connected through magnet stack 480. To further boost the benefits realized by the permanent magnets, some or all of the traces on the circuit board may comprise a non-permanent-magnet ferromagnetic material, such as nickel, which could be coated with copper for conductivity. Alternatively, trace leads comprising ferromagnetic material on the board may be permanent magnets themselves. Alternatively, the trace leads may be ferromagnetic, and the permanent magnets are located in either components or cables connected to the circuit board. Here again, other materials disclosed herein may be used for any of the respective materials. As with other embodiments, single permanent magnets may be used in circuit board implementations instead of magnet stacks.

Figure 21:
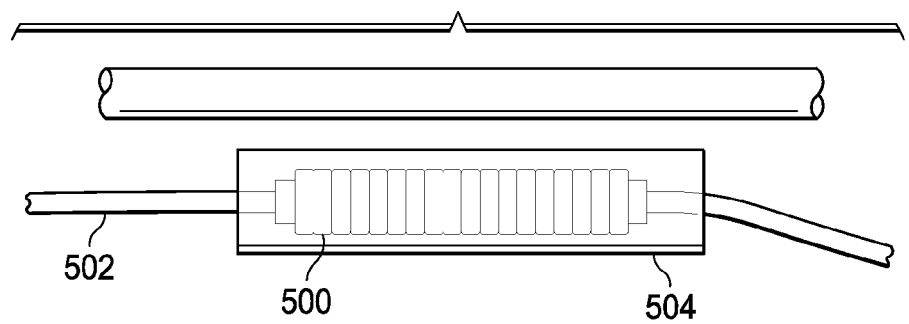
FIG. 21 is a diagram of a power cable having a permanent magnet stack disposed in the active signal path.

As with single permanent magnets, stacked magnets generally provide a greater benefit when used in conjunction with a non-permanent-magnet ferromagnetic or high magnetic permeability conductor, such as nickel, steel, and others described hereinabove. Thus, any of the stacked magnet embodiments disclosed herein may utilize a ferromagnetic conductor for the cable wiring. FIG. 21 illustrates an embodiment in which stacked magnets 500 are in used in the hot lead of a power cable 502. The magnet stack 500 is protected by an insulating sheath 504. Magnet stacks also may be implemented in the neutral and ground leads of the power cable.

This embodiment further comprises steel wire coated in copper and silver for the wiring. The steel provides a non-permanent-magnet ferromagnetic material to enhance the magnetic field of the stacked magnets, and the silver/copper coating provides corrosion resistance and conductivity.

Figure 22:
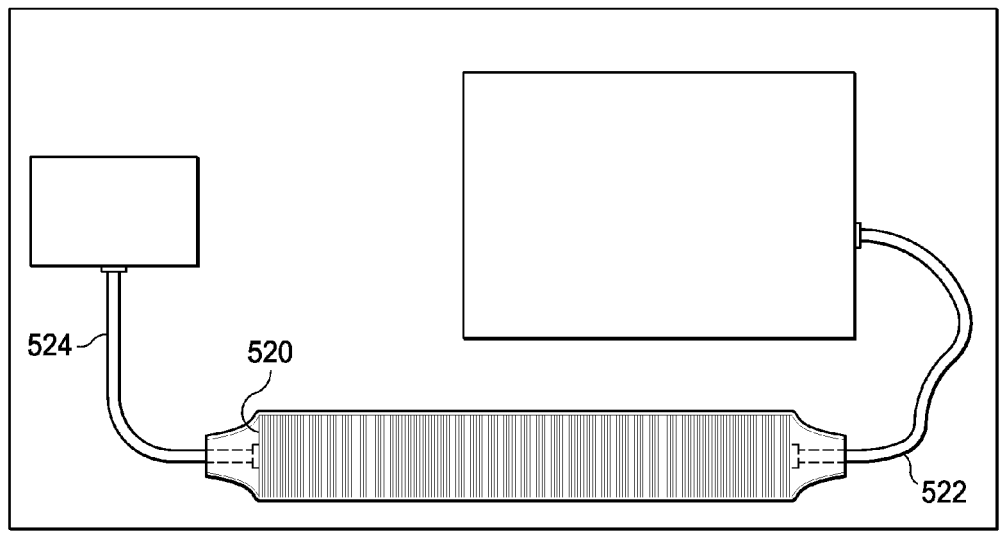
FIG. 22 is a diagram of a permanent magnet stack in a power signal path of an alternating circuit (AC) circuit.

FIG. 22 illustrates another power signal embodiment. In this embodiment magnet stack 520 comprises hundreds of thin magnets. The magnets are about 1/32 of an inch thick, and thus a great many of them fit within a small space. In FIG. 22, magnet stack 520 is disposed in the hot AC lead providing power to a transformer disposed on the circuit board. Wires 522 and 524 connect the magnet stack between AC power and the transformer. The other AC leads may also comprise single magnets or magnet stacks. In this experiment the wires were copper, but they also could be ferromagnetic material. In any given embodiment the stack of magnets may contain any number of magnets, such as two or more magnets, five or more magnets, ten or more magnets, fifty or more magnets, or one hundred or more magnets.

Figure 23:
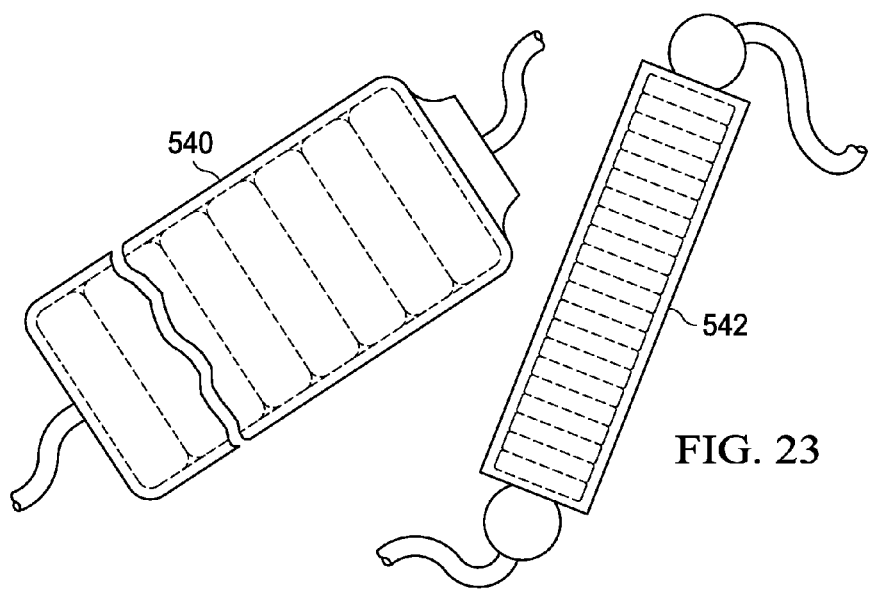
FIG. 23 is a diagram of sheaths or Faraday cages for permanent magnet stacks used in power signal circuit paths.

FIG. 23 illustrates other methods of mounting or insulating stacked magnets. A magnet stack is disposed within heat shrink tubing 540, and is connected between the active signal output of a transformer and a bridge rectifier. Another magnet stack is disposed within steel tube 542, and is connected to the neutral lead on the output side of the transformer. In this implementation, the steel tube may act as a Faraday cage to block electric fields and some electromagnetic radiation.

Alternatively, an insulation layer may be disposed between the steel tube and the magnets. The Faraday cage may be a conducting or ferromagnetic material, and may be implemented as a solid or mesh of such material. If a mesh is used, the holes in the mesh generally should be significantly smaller than the frequency of the electromagnetic radiation generated by the signal traveling through the magnet(s). The Faraday cage may be ungrounded, grounded on one side of a cable, or grounded on both sides of a cable. A single conductive tube may be used, or multiple (e.g., two, three, four) concentric tubes may be used.

A Faraday cage may be used with other single or stacked magnet embodiments disclosed herein, and may be particularly effective for alternating current or fast-changing signal applications. For example, a Faraday cage may be used for the outer ground of an RCA connector. As another alternative, an insulating tube made of, e.g., plastic, acrylic, plexiglass, a flexible laminate or other dielectric material may be disposed on the outside of the Faraday cage.

Figure 24A:
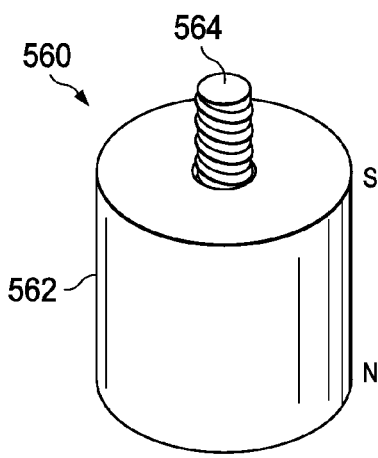
FIG. 24a is a diagram of a binding post screw.
Figure 24B:
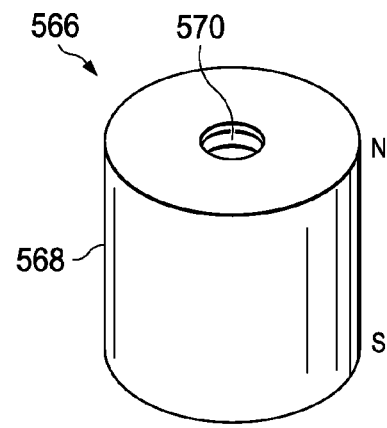
FIG. 24b is a diagram of a binding post receptacle.

FIGS. 24a and 24b illustrate a binding post screw 560 and associated binding post receptacle 566, which may be used, for example, with speaker cable connections. In this embodiment, cylinder magnet 562, which may comprise any of the magnetic materials disclosed herein, is fitted with a threaded steel pin 564. Alternatively, the pin may comprise other metals such as nickel, copper, and the like. The steel pin 564 may be, for example, compression fit into the magnet 562, it may be glued into magnet 562, or both.

Similarly, binding post receptacle 566 has a cylinder magnet 568, but with a threaded female steel insert 570 for mating with the pin 564 of binding post screw 560. As with pin 564, insert 570 may comprise other metals such as nickel, copper, and the like. The steel insert 570 may be, for example, compression fit into the magnet 568, it may be glued into magnet 568, or both. The north-south poles of the magnets are oriented so that they align with each other when the binding post screw 560 is inserted into the binding post receptacle 566. The poles of the magnets may be reversed from that shown in the figures. Furthermore, stacked magnets may be used for the cylinder magnets 562 and 568 of FIGS. 24a and 24b. As with other embodiments described herein, the magnets disposed in the signal path generally improve the quality of the signal transmission.

Figure 25A:
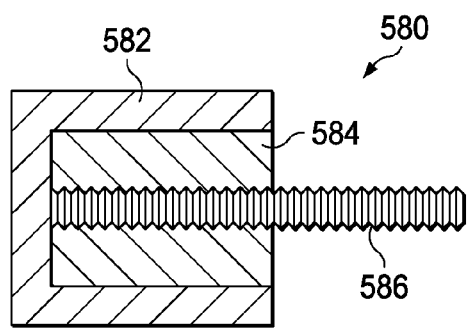
FIGS. 25a and 25b are diagrams of a binding post screw cross-section.
Figure 25B:
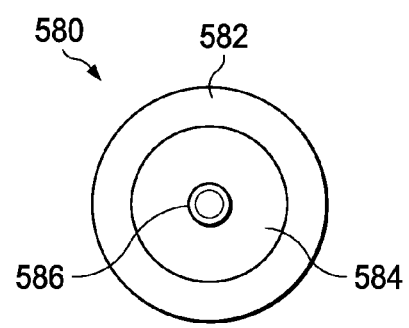

In an alternative embodiment, FIGS. 25a and 25b illustrate a binding post screw 580 in which the permanent magnet is contained within an outer shell. FIG. 25a shows a lengthwise cross section of screw 580, and FIG. 25b shows an axial cross-section of screw 580. In this embodiment, screw 180 has a threaded pin 586 inserted into cylindrical magnet 584, which itself is embedded within an outer metal shell 582. The materials for pin 586 and magnet 584 may be the same as those described for the embodiment of FIG. 24a. Stacked magnets may be used for permanent magnet 584. The outer metal shell may comprise a ferromagnetic material such as steel or nickel, or those materials listed in other embodiments disclosed herein.

Figure 26A:
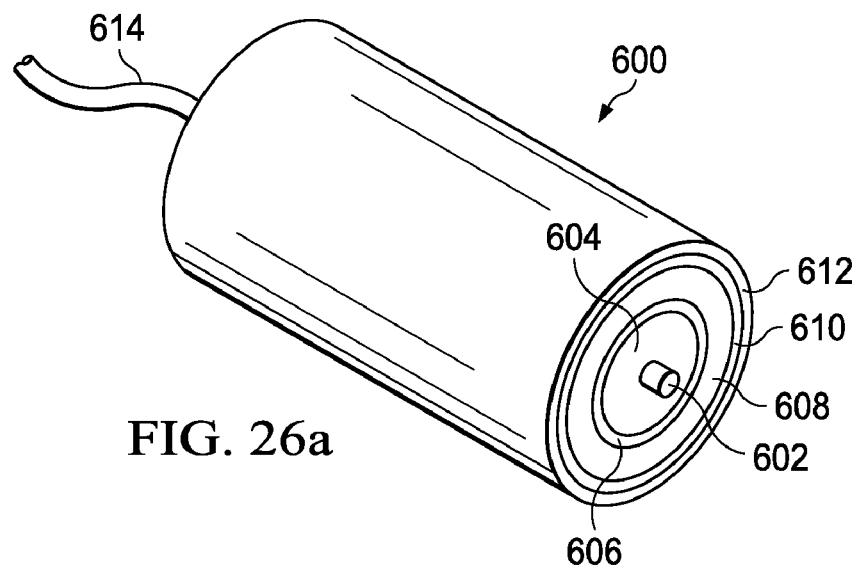
FIGS. 26a and 26b are diagrams of connectors utilizing magnets for electrical and physical connection.
Figure 26B:
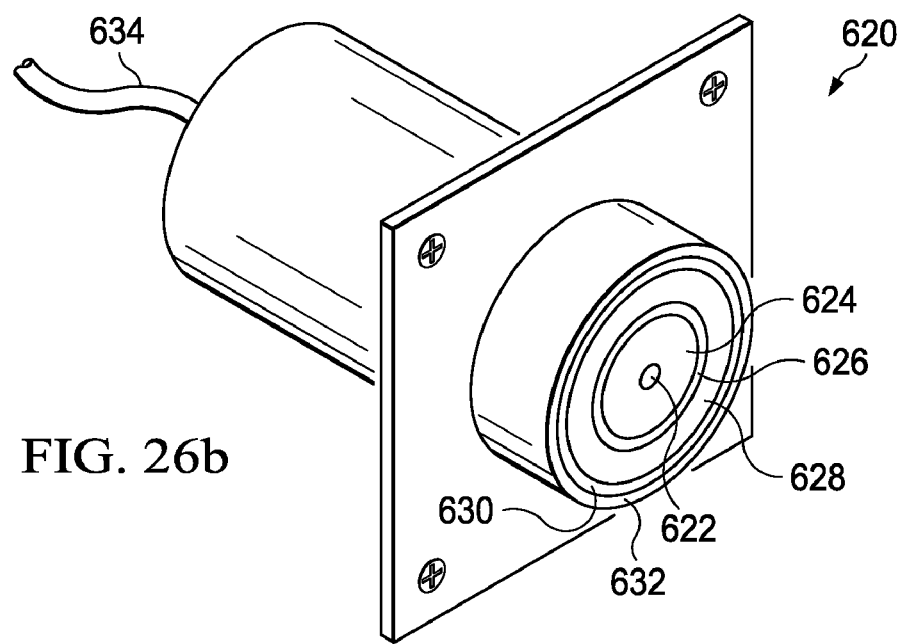

FIGS. 26a and 26b illustrate another connector embodiment in which the connectors comprise permanent magnets for electrical and physical connection. Male connector 600 shown in FIG. 26a includes active signal center pin 602. Center pin 602 comprises a permanent magnet made of any combination of materials described in other embodiments disclosed herein. Surrounding center pin 602 is an insulator 604, which may comprise any combination of materials described in other embodiments disclosed herein. Center pin 602 may be spring loaded with an internal spring disposed within the connector along side and/or behind the pin. The pin may be movable against the force of the spring inward toward the main body of connector 600. Alternatively, the spring may provide a force against the pin moving outward from the connector body so as to provide a resistance to the magnetic attraction between the magnets from slamming the magnets together with excessive force. In this case, the spring may alternatively be mounted on the external face of either of the connectors. As another alternative, the pin may be hard mounted flush or extended slightly beyond insulator 604.

Surrounding insulator 604 is a first cylindrical conductor 606. In various embodiments this conductor may comprise a ferromagnetic material such as steel, nickel, and the like, or a non-ferromagnetic material such as copper, brass, and the like, or a permanent magnet material such as neodymium, alnico, and the like. In some embodiments conductor 606 may provide a ground signal, or it may act as a Faraday cage, or both. In other embodiments conductor 606 may provide a second active signal in addition to the one carried by center pin 602.

The remaining components of the connector are optional and may be included or not in different embodiments. Surrounding conductor 606 is another insulator 608, and around insulator 608 is a second cylindrical conductor 610. In various embodiments this conductor may comprise a ferromagnetic material such as steel, nickel, and the like, or a non-ferromagnetic material such as copper, brass, and the like, or a permanent magnet material such as neodymium, alnico, and the like. In some embodiments conductor 610 may provide a ground signal, or it may act as a Faraday cage, or both. As with other embodiments disclosed herein, multiple stacked permanent magnets may be used for the permanent magnets in connector 600. Lastly, surrounding conductor 610 is another insulating layer 612. Cable 614 contains wires connected to the conductors in connector 600 for carrying signals between electrical devices.

Female connector 620 shown in FIG. 26b may be mounted on an electrical device. Female connector may be flush mounted to the device, or it may be mounted extended beyond or retracted within the device. Similar to the male connector, female connector 620 includes active signal center pin 622.

Center pin 622 comprises a permanent magnet made of any combination of materials described in other embodiments disclosed herein. Surrounding center pin 622 is an insulator 624, which may comprise any combination of materials described in other embodiments disclosed herein. Center pin 622 may be hard mounted flush or extended slightly beyond or behind insulator 624. Alternatively, the pin may be spring loaded with an internal spring disposed within the connector along side and/or behind the pin. The pin may be movable against the force of the spring inward toward the main body of connector 620.

Surrounding insulator 624 is a first cylindrical conductor 626. In various embodiments this conductor may comprise a ferromagnetic material such as steel, nickel, and the like, or a non-ferromagnetic material such as copper, brass, and the like, or a permanent magnet material such as neodymium, alnico, and the like. In some embodiments conductor 626 may provide a ground signal, or it may act as a Faraday cage, or both. In other embodiments conductor 626 may provide a second active signal in addition to the one carried by center pin 622.

The remaining components of the connector are optional and may be included or not in different embodiments. Surrounding conductor 626 is another insulator 628, and around insulator 628 is a second cylindrical conductor 630. In various embodiments this conductor may comprise a ferromagnetic material such as steel, nickel, and the like, or a non-ferromagnetic material such as copper, brass, and the like, or a permanent magnet material such as neodymium, alnico, and the like. In some embodiments conductor 630 may provide a ground signal, or it may act as a Faraday cage, or both. As with other embodiments disclosed herein, multiple stacked permanent magnets may be used for the permanent magnets in connector 600. Lastly, surrounding conductor 630 is another insulating layer 632. Cable 634 contains wires connected to the conductors in connector 600 for carrying signals within an electrical device.

Male connector 600 may connect to female connector 620 simply by placing the male connector aligned with and adjacent to the female connector. The magnetic attraction between corresponding magnets in the connectors will physically draw the connectors together in proper alignment. Accordingly, the poles of the corresponding magnets generally should be oriented so that they attract each other. For example, the male connector may have its center pin north pole at the end of the connector, and the female connector may have its center pin south pole at the end of the connector. Likewise, if other magnets are used for other conductors in the connectors, their poles should be aligned as well. For example, if the male connector cylindrical conductor 606 is a permanent magnet and has its south pole at the end of the connector, then the female connector conductor 626 may be a permanent magnet having its north pole at the end of the connector.

Furthermore, if two connectors are paired on an electrical device, such as two connectors for the signal and return to a speaker, then the connectors may have opposite permanent magnet orientation to assist in proper connection of cables to the device. That is, a first female connector may have a center pin south pole disposed at the end of the connector, while a second female connector may have a center pin north pole disposed at the end of the connector. Likewise, two cables may have connectors with center pins having opposite poles disposed at the end of the connectors. Because of the magnetic attraction of opposite poles, and the repulsion of like poles, the cables and their connectors generally may only connect to the device in one way. That is, the cable connector with the north pole at its center pin tip may only connect to the device connector with the south pole at its center pin tip, and the cable connector with the south pole at its center pin tip may only connect to the device connector with the north pole at its center pin tip. As an alternative, only one of the two connectors 600 and 620 may comprise one or more magnets, and the other connector may comprise ferromagnetic material in place of its magnet(s).

FIG. 27 illustrates an electrical system showing the coordinated orientation of magnets placed throughout the system. In this example, the permanent magnets are oriented such that the north pole of the magnets generally faces the source of that signal, and the south pole faces downstream from the signal source. In general, high-voltage multi (e.g., single, two or three) phase power is supplied from the power grid via transmission lines 650. As explained in more detail below, permanent magnets may be disposed in-line at various points of the power grid, for example at transmission line towers, telephone poles, underground junction boxes, and the like. The permanent magnets may have the same orientation on the multiple phases, as shown by the N/S arrow next to the three high voltage lines 650.

The high voltage lines feed into a step-down transformer 652, which is connected to ground 654 and drops the high voltage down to standard 120V/240V power on power signal lines 656 and neutral line 658. Permanent magnets may be disposed at the inputs and outputs of step-down transformer 652. The permanent magnets follow the orientation of the signal flow in a given cable or interface, with active signals flowing in one direction and the associated ground or neutral signals flowing in the opposite direction. For example, permanent magnets in active signal (hot) leads 656 have north/south orientations, and in the neutral line 658 have a south/north orientation, as shown in FIG. 27. These lines feed into breaker box 660, which is disposed, for example, at a residential or commercial location. Breaker box 660 also may be connected to ground 662 and may have permanent magnets installed in the input and output signal paths, again with the active signal leads 656 and 664 and ground 662 permanent magnets having north/south orientations, and the neutral lines 658 and 668 and ground 666 permanent magnets having south/north orientations.

Power lines comprising active power signal 664, neutral line 668 and ground line 666 run from the breaker box 660 to wall outlet 670. Wall outlet also may have permanent magnets disposed in the signal paths with orientations shown in FIG. 27. A power cable 672 may be plugged into wall outlet 670, and have permanent magnets disposed in its connectors 674 and 676, similar to those shown in FIG. 7. An audio-video system comprises components 152, 158, 160, 166 and 168, as shown in FIG. 3, and may receive power from power cable 672. The components that receive power may have permanent magnets disposed at their power connectors corresponding to those in power cable 672 connector 676, similar to that of with wall outlet 670.

Permanent magnets utilized with the data signals transferred between the components of the audio-video system also follow the magnetic orientation of the power signals. Speaker cables 162 and 164 have magnets installed in their connectors such that each active signal being transmitted to each speaker has a north/south orientation, and the neutral signals being sent back have south/north orientations, with respect to amplifier 160. In data cables transmitting signals between source component 152 and monitor 158, and between source component 152 and amplifier 160, permanent magnets again follow the orientation convention of the rest of the system. That is, in cables 154 and 156, the magnetic north pole of the magnets in the active signal path faces the source component output, while the magnetic north pole of the magnets in the neutral/ground signal path faces the destination component input (monitor 158 and amplifier 160).

As an alternative, stacked magnets may be used for one or more or all of the magnets described in FIG. 27. As another alternative, all of the magnet orientations may be reversed from that described above for FIG. 27. Generally, in some embodiments, it may be beneficial to utilize the orientation shown in FIG. 27 in the northern hemisphere, while the opposite orientation may be used for all the magnets in the southern hemisphere. As another alternative, the permanent magnets may be disposed in any orientation relative to each other (e.g., north/south-south/north, north/south-north/south, south/north-south/north, south/north-north/south). In some embodiments, only some of the magnets described in FIG. 27 are present in specific systems.

Figure 28A:
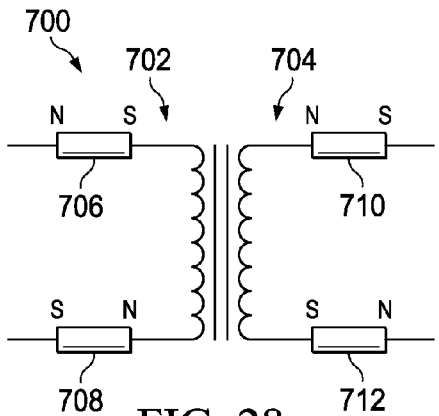
FIGS. 28a, 28b and 28c are diagrams of transformers incorporating magnets at their terminals.
Figure 28B:
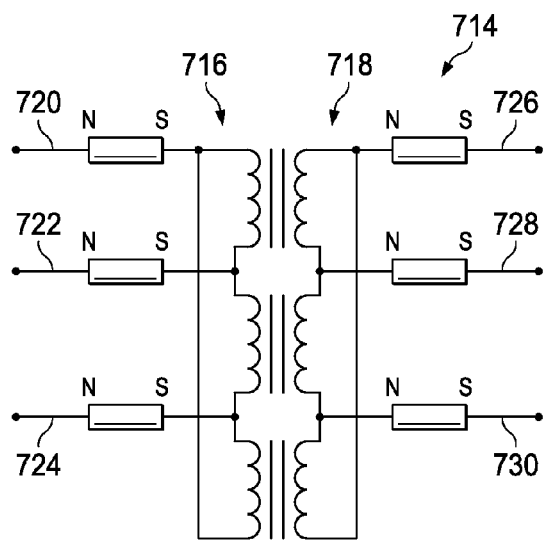
Figure 28C:
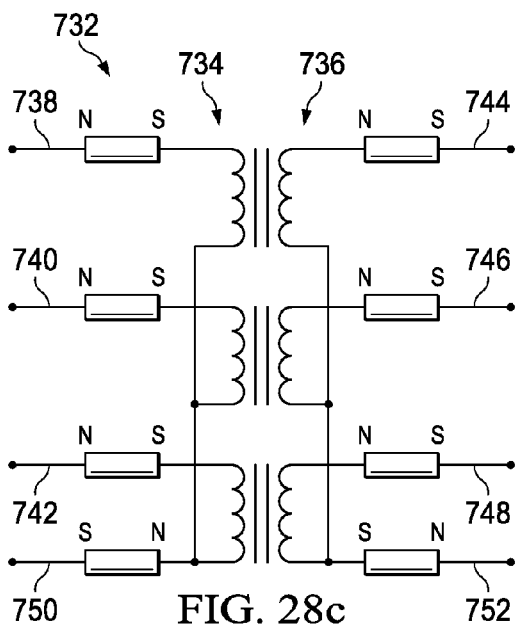
Figures 29, 30:
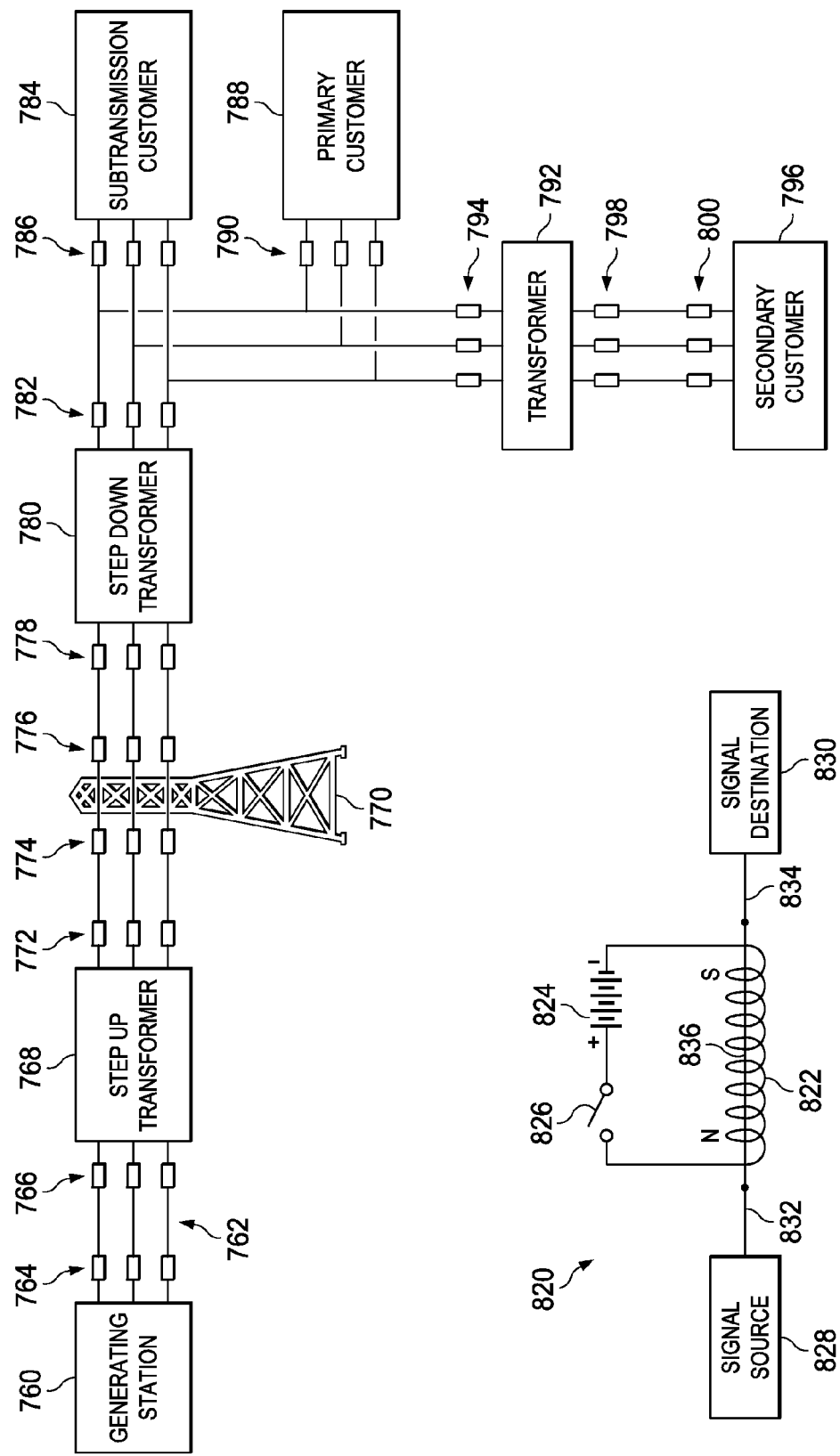
FIG. 29 is a diagram of an electrical power grid incorporating magnets at various locations in the system.
FIG. 30 is a diagram of an electromagnet having a magnetic field disposed along a signal conductor.

Further application to low and high voltage power lines is illustrated in FIGS. 28 and 29. High voltage power energy transfer for private and public use is done through above ground or underground high voltage AC or DC transmission wires. AC power may be single-phase, two-phase or three-phase. Voltages generally are stepped up at power sources with transformers, the power is transmitted at high voltage, and then the voltages are stepped down with transformers for use at electricity user sites, such as industrial sites, commercial sites, residential sites, and the like.

Large permanent magnets installed in the power circuit paths of power lines generally will improve energy transfer and efficiency. As with other embodiments disclosed herein, single or stacked permanent magnets may be installed in devices, in connectors, or in-line with cable wiring. For example, permanent magnets may be installed at the inputs and/or outputs of the step-up and step-down transformers. FIGS. 28*a*, 28*b* and 28*c* illustrate different transformers incorporating permanent magnets at their terminals. Single-phase transformer 700 has a primary winding 702 and a secondary winding 704 that are inductively coupled to each other through a ferromagnetic core, an air core, or the like. The ratio of the turns in each winding determines the relative voltage generated in the secondary winding. For example, in a step-up transformer, the secondary winding has more turns than the primary winding, and the output voltage at the secondary winding is greater than the input voltage at the primary winding. On the other hand, in a step-down transformer, the secondary winding has less turns than the primary winding, and the output voltage at the secondary winding is lower than the input voltage at the primary winding. For all of the transformers disclosed herein, the wires in the primary and secondary windings may comprise a ferromagnetic material, such as nickel, steel, and the like.

Transformer 700 comprises permanent magnets 706 and 708 disposed in the input signal path at its input terminals, and permanent magnets 710 and 712 disposed in the output signal path at its output terminals. The permanent magnets may be single magnets or stacked magnets, and may comprise any of the magnet materials disclosed in other embodiments hereinabove. As an alternative, the orientations of the magnets may be reversed from that shown in FIG. 28*a*. Three such transformers may be used to step up or step down three-phase power.

Transformers 714 and 732 shown in FIGS. 28*b* and 28*c*, respectively, are three-phase transformers useful in stepping up or stepping down three-phase power. Transformer 714 is structured in a delta-delta configuration, and transformer 732 is structured in a wye-wye configuration. A three phase transformer also may be structured in a wye-delta configuration or a delta-wye configuration. Transformer 714 has three primary windings 716, and three secondary windings 718. Transformer 714 has three inputs, input A 720, input B 722, and input C 724, as well as three corresponding outputs, output A 726, output B 728, and output C 730. Transformer 714 comprises permanent magnets at each of its inputs in the input signal path and at each of its outputs in the output signal path. The permanent magnets may be single magnets or stacked magnets, and may comprise any of the magnet materials disclosed in other embodiments hereinabove. As an alternative, the orientations of the magnets may be reversed from that shown in FIG. 28*b*, or disposed in any orientation relative to each other (e.g., north/south-south/north, north/south-north/south, south/north-south/north, south/north-north/south).

Transformer 732 has three primary windings 734, and three secondary windings 736. Transformer 732 has three power inputs, input A 738, input B 740 and input C 742, and neutral input 750, as well as three corresponding power outputs, output A 744, output B 746 and output C 748, and neutral output 752. Transformer 732 comprises permanent magnets at each of its inputs in the input signal path and at each of its outputs in the output signal path. The permanent magnets may be single magnets or stacked magnets, and may comprise any of the magnet materials disclosed in other embodiments hereinabove. As an alternative, and as with any embodiment disclosed herein, the orientations of the magnets may be reversed from that shown, or disposed in any orientation relative to each other (e.g., north/south-south/north, north/south-north/south, south/north-south/north, south/north-north/south).

Furthermore, additional benefits may be obtained using permanent magnets in conjunction with ferromagnetic conductor wire to increase the effect of the magnetic fields. Utilizing permanent magnets or electromagnets to charge ferromagnetic wire with magnetic energy generally would be beneficial to energy efficiency and the accuracy of data transfer. In particular, a ferromagnetic material, such as nickel, steel, or others disclosed herein, may be used as conductors in power transmission lines. Charging a ferromagnetic center core conductor with single or stacked permanent magnets generally would offer advantages to energy transfer, based on observations in power supplies, power conditioners and power cabling products. FIG. 29 illustrates a high level view of an electrical power grid incorporating permanent magnets and ferromagnetic conductors at various locations in the system. Generating station 760 may be a coal power plant, a nuclear power plant, a hydroelectric power plant, and the like. Generating station 760 produces electrical power for the power grid from energy sources such as coal, nuclear, and dammed water.

The electrical power is sent to a step-up transformer 768 via power lines 762. Power lines 762 may comprise ferromagnetic conductors and have permanent magnets 764, 766 disposed in line with the ferromagnetic conductors. Alternatively, the conductors may be non-ferromagnetic. Permanent magnets 764 may be disposed at the output of the generating station, and permanent magnets 766 may be disposed at the input of the step-up transformer 768. Alternatively, permanent magnets may be disposed elsewhere in-line with the conductors.

Step-up transformer 768 steps up the voltage on power lines 762 to three-phase high voltage for long distance transmission via high power transmission lines and transmission towers 770. The high voltage, which may be 110 kV and higher (e.g., 138 kV, 230 kV, 345 kV, 500 kV, and 765 kV), transmits over long distances with less energy loss than lower voltage power. The transmission lines and transmission towers 770 transmit power to local areas that will use the power, at which point the high voltage is stepped down to a lower voltage by step-down transformer 780. The conductors carrying the energy between the transformers may comprise a ferromagnetic material such as steel or nickel. The step-up transformer 768 may have permanent magnets 772 disposed in-line at its outputs to the high voltage transmission lines, and the step-down transformer 780 may have permanent magnets 778 disposed in-line at its inputs from the high voltage transmission lines Likewise, permanent magnets may be disposed periodically throughout the transmission lines, such as permanent magnets 774 and 776 disposed in-line with the conductors at transmission towers 770.

Step-down transformer 780 steps down the three-phase high voltage to a three-phase low voltage, such as 4 kV, 13 kV, 26 kV, 50 kV or 69 kV for transmission over shorter distances. The conductors between step-down transformer 780 and subsequent entities or customers may comprise ferromagnetic material such as steel or nickel. Alternatively, the conductors may be non-ferromagnetic. Industrial, government and other subtransmission customers 784 and primary customers 788 may receive power directly from the stepped-down output of the step-down transformer 780. These entities also may provide power back to the power grid based on power demand and excess capacity.

The step-down transformer 780 may have permanent magnets 782 disposed in-line at its outputs to the low voltage lines, and subtransmission customers 784 and primary customers 788 may have permanent magnets 786 and 790 disposed in-line at their inputs from the low voltage lines. As with the high voltage lines, permanent magnets may be disposed periodically throughout the low voltage transmission lines, such as in-line with the conductors at low voltage utility poles or towers.

Another transformer 792 converts the low voltage from the step-down transformer 780 to single-phase household voltages such as 110V/220V (or 117V/134V, or 120V/240V) for use by industrial, commercial, and residential secondary customers 796. Again, the conductors in the single phase power lines may comprise ferromagnetic materials such as steel nickel, and the like. Transformer 792 may have permanent magnets 798 disposed in-line at its outputs to the single phase power lines, and secondary customers 788 may have permanent magnets 800 disposed in-line at their inputs from the household voltage lines. As with the higher voltage lines, permanent magnets may be disposed periodically throughout the household lines and in the equipment and devices connected to such lines, as shown hereinabove in FIG. 27. Any of the magnets shown in FIG. 29 may be implemented as single magnets or stacked magnets.

In alternative implementations, electromagnets may be substituted in place of the permanent magnets used in the embodiments disclosed herein. For example, FIG. 30 depicts electromagnet 820 comprising a wire coil 822, power source 824, and switch 826. Wire coil may comprise a conductive wire encased within an insulating sheath. The wire material may comprise copper, aluminum, silver, gold, etc., and combinations thereof.

Electromagnet 820 may be turned on and off by closing or opening switch 826. Switch 826 may be any type of switch with sufficient capacity to carry the current used to power the electromagnet for a given application. As examples, switch 826 may be a mechanical switch, and may be driven by a relay, or it may be a solid state switch such as a transistor driven by a controller for the electromagnet. When switch 826 is closed, current is provided to wire coil 822 by power source 824. Depending on the application, power source 824 may be a battery, a power supply, a rectifier, an AC-DC converter, and the like. The current flowing through wire coil 822 generates a magnetic field around the wire, a concentrated portion of which is located through the middle of the coil.

As stated above, electromagnet 820 may be implemented in place of the permanent magnet embodiments disclosed herein. Generally, because of the added cost, bulk and power requirements, electromagnets may be preferred in applications where the benefits of the electromagnets compensate for the additional requirements. For example, electromagnets may be used in place of the permanent magnets in power transmission lines of FIG. 29, in conjunction with the transformers of FIG. 28, or in conjunction with the power signals shown in FIG. 27.

Specifically, electromagnet 820 may be implemented between a signal source 828 and a signal destination 830. Signal source outputs a signal on conductor 832, and signal destination 830 received the signal on conductor 834. Conductor 836 electrically connects conductor 832 and conductor 836. In some embodiments, all three conductors are the same material, and may be the same wire or cable. The wire material may comprise a non-ferromagnetic material, such as copper, aluminum, silver, gold, etc., and combinations thereof.

In other embodiments, conductor 836 is a different material. For example, conductors 832 and 836 may be a non-ferromagnetic material such as copper, while conductor 834 may be a ferromagnetic material such as iron, steel, nickel, cobalt, and the like. A ferromagnetic material focuses the magnetic field of wire coil 822, further enhancing the magnetic effect on the signal in conductor 834. Conductors 832 and 834 may comprise a ferromagnetic material as well. In any of the embodiments, any remaining space within the wire core may be an insulator such as ambient gas, air, wire sheathing, a solid dielectric material, and the like.

As another application, one or more single or stacked permanent magnets may be used in lightning or other grounding rod embodiments. In a lightning rod system, a metal rod generally is installed at a relatively high point on a structure, and is connected to earth ground through a conductor. The permanent magnet structure may be used at any location through the system, such as at the lightning rod, in one or more places along the conductor, at the ground connection or rod, and any combination thereof. If there are multiple magnet structures, they may have any orientation for the magnetic fields, but preferably are aligned so that they are all north-south, north-south, or south-north, south-north, from the lightning rod to the ground connection.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An electrical connector comprising:
   a connector body;
   a first active signal contact mechanically attached to and at least partially disposed within the connector body;
   a ground contact mechanically attached to the connector body;
   an insulator mechanically separating and electrically isolating the first active signal contact and the ground contact; and
   a first permanent magnet electrically connected to the first active signal contact.

2. The electrical connector of claim 1, wherein the first permanent magnet comprises a material selected from the group consisting of: nickel, neodymium, samarium, mu-metal, cobalt, and combinations thereof.

3. The electrical connector of claim 1, further comprising a non-permanent-magnet ferromagnetic conductor electrically coupled to the first permanent magnet.

4. The electrical connector of claim 1, wherein the first active signal contact is a pin.

5. The electrical connector of claim 1, wherein the first active signal contact is a socket.

6. The electrical connector of claim 1, further comprising an electrically conductive sleeve surrounding an exterior of the first permanent magnet.

7. The electrical connector of claim 1, wherein at least a portion of the first permanent magnet is part of the first active signal contact.

8. The electrical connector of claim 1, wherein the first permanent magnet is disposed completely within the connector body.

9. The electrical connector of claim 1, wherein the first permanent magnet comprises a first material, and further comprises a coating of conductive metal different from the first material.

10. The electrical connector of claim 1, wherein the first active signal contact comprises a non-permanent-magnet ferromagnetic material.

11. A method of forming an electrical connector, the method comprising:
    attaching a first active signal contact to a connector body, wherein the first active signal contact is disposed at least partially within the connector body;
    attaching a ground contact to the connector body;
    electrically insulating the first active signal contact from the ground contact; and
    electrically connecting a first permanent magnet to the first active signal contact.

12. The method of claim 11, wherein the first permanent magnet comprises a material selected from the group consisting of: nickel, neodymium, samarium, mu-metal, cobalt, and combinations thereof.

13. The method of claim 11, further comprising electrically coupling a non-permanent-magnet ferromagnetic conductor to the first permanent magnet.

14. The method of claim 11, wherein the first active signal contact is a pin.

15. The method of claim 11, wherein the first active signal contact is a socket.

16. The method of claim 11, further comprising surrounding an exterior of the first permanent magnet with an electrically conductive sleeve.

17. The method of claim 11, wherein at least a portion of the first permanent magnet is part of the first active signal contact.

18. The method of claim 11, further comprising disposing the first permanent magnet completely within the connector body.

19. The method of claim 11, wherein the first permanent magnet comprises a first material, and further comprises a coating of conductive metal different from the first material.

20. The method of claim 11, wherein the first active signal contact comprises a non-permanent-magnet ferromagnetic material.

21. An electrical connector comprising:
    a connector body;
    a first active signal contact mechanically attached to and at least partially disposed within the connector body;
    a second contact mechanically attached to the connector body;
    an insulator mechanically separating and electrically isolating the first active signal contact and the second contact;
    a plurality of stacked permanent magnets electrically connected in series with the first active signal contact; and
    a Faraday cage surrounding an exterior of the plurality of stacked permanent magnets.

22. The electrical connector of claim 21, wherein the permanent magnets comprise a material selected from the group consisting of: nickel, neodymium, samarium, mu-metal, cobalt, and combinations thereof.

23. The electrical connector of claim 21, further comprising a non-permanent-magnet ferromagnetic conductor electrically coupled to the plurality of stacked permanent magnets.

24. The electrical connector of claim 21, wherein the first active signal contact is a pin.

25. The electrical connector of claim 21, wherein the first active signal contact is a socket.

26. The electrical connector of claim 21, wherein the plurality of stacked permanent magnets are disposed completely within the connector body.

27. The electrical connector of claim 21, wherein each of the permanent magnets comprises a first material, and further comprises a coating of conductive metal different from the first material.

28. The electrical connector of claim 21, wherein the first active signal contact comprises a non-permanent-magnet ferromagnetic material.

29. A method of forming an electrical connector, the method comprising:
    attaching a first active signal contact to a connector body, wherein the first active signal contact is disposed at least partially within the connector body;
    attaching a second contact to the connector body;
    electrically insulating the first active signal contact from the second contact;
    electrically connecting a plurality of stacked permanent magnets in series with the first active signal contact; and
    disposing a Faraday cage surrounding an exterior of the plurality of stacked permanent magnets.

30. The method of claim 29, wherein the permanent magnets comprise a material selected from the group consisting of: nickel, neodymium, samarium, mu-metal, cobalt, and combinations thereof.

31. The method of claim 29, further comprising electrically coupling a non-permanent-magnet ferromagnetic conductor to the plurality of stacked permanent magnets.

32. The method of claim 29, wherein the first active signal contact is a pin.

33. The method of claim 29, wherein the first active signal contact is a socket.

34. The method of claim 29, further comprising disposing the plurality of stacked permanent magnets completely within the connector body.

35. The method of claim 29, wherein each of the permanent magnets comprises a first material, and further comprises a coating of conductive metal different from the first material.

36. The method of claim 29, wherein the first active signal contact comprises a non-permanent-magnet ferromagnetic material.

37. An electrical connector comprising:
   a connector body;
   a first active signal contact mechanically attached to and at least partially disposed within the connector body;
   a first permanent magnet electrically connected to the first active signal contact;
   a second contact mechanically attached to the connector body;
   a second permanent magnet electrically connected to the second contact; and
   an insulator mechanically separating and electrically isolating the first active signal contact and the second contact.

38. The electrical connector of claim 37, wherein the first and second permanent magnets each comprises a material selected from the group consisting of: nickel, neodymium, samarium, mu-metal, cobalt, and combinations thereof.

39. The electrical connector of claim 37, wherein the first and second contacts each comprises a non-permanent-magnet ferromagnetic material.

40. The electrical connector of claim 37, wherein the first active signal contact is a first pin, and wherein the second contact is a second pin.

41. The electrical connector of claim 37, wherein the first active signal contact is a first socket, and wherein the second contact is a second socket.

42. The electrical connector of claim 37, further comprising a first electrically conductive sleeve surrounding an exterior of the first permanent magnet, and a second electrically conductive sleeve surrounding an exterior of the second permanent magnet.

43. The electrical connector of claim 37, wherein at least a portion of the first permanent magnet is part of the first active signal contact.

44. The electrical connector of claim 37, wherein the first and second permanent magnets are disposed completely within the connector body.

45. The electrical connector of claim 37, wherein a first north-south orientation of the first permanent magnet is opposite a second north-south orientation of the second permanent magnet, relative to the contacts.

46. The electrical connector of claim 37, wherein the second contact is a ground contact.

47. The electrical connector of claim 37, further comprising a third contact mechanically attached to the connector body, and electrically isolated from the first and second contacts.

48. The electrical connector of claim 37, wherein at least one of the first and second permanent magnets comprises a plurality of stacked permanent magnets.

49. The electrical connector of claim 48, further comprising a Faraday cage disposed around the plurality of stacked permanent magnets.

50. A method of forming an electrical connector, the method comprising:
   attaching a first active signal contact to a connector body, wherein the first active signal contact is disposed at least partially within the connector body;
   attaching a second contact to the connector body;
   electrically insulating the first active signal contact from the second contact;
   electrically connecting a first permanent magnet to the first active signal contact; and
   electrically connecting a second permanent magnet to the second contact.

51. The method of claim 50, wherein the first and second permanent magnets each comprises a material selected from the group consisting of: nickel, neodymium, samarium, mu-metal, cobalt, and combinations thereof.

52. The method of claim 50, further comprising:
   electrically coupling a first non-permanent-magnet ferromagnetic conductor to the first permanent magnet; and
   electrically coupling a second non-permanent-magnet ferromagnetic conductor to the second permanent magnet.

53. The method of claim 50, wherein the first active signal contact is a first pin, and wherein the second contact is a second pin.

54. The method of claim 50, wherein the first active signal contact is a first socket, and wherein the second contact is a second socket.

55. The method of claim 50, wherein the second contact is a ground contact.

56. The method of claim 50, further comprising:
   surrounding an exterior of the first permanent magnet with a first electrically conductive sleeve; and
   surrounding an exterior of the second permanent magnet with a second electrically conductive sleeve.

57. The method of claim 50, wherein at least a portion of the first permanent magnet is part of the first active signal contact.

58. The method of claim 50, further comprising disposing the first and second permanent magnets completely within the connector body.

59. The method of claim 50, further comprising orienting a first north-south orientation of the first permanent magnet opposite to a second north-south orientation of the second permanent magnet, relative to the contacts.

60. The method of claim 50, further comprising:
   attaching a third contact to the connector body; and
   electrically isolated the third contact from the first and second contacts.

61. The method of claim 50, wherein at least one of the first and second permanent magnets comprises a plurality of stacked permanent magnets.

62. The method of claim 61, further comprising disposing a Faraday cage around the plurality of stacked permanent magnets.

* * * * *